US012740268B2

(12) United States Patent
Lee et al.

(10) Patent No.: US 12,740,268 B2

(45) Date of Patent: Sep. 15, 2026

(54) DISPLAY PANEL AND DISPLAY DEVICE INCLUDING THE SAME

(71) Applicant: Samsung Display Co., Ltd., Yongin-si (KR)

(72) Inventors: Wonse Lee, Yongin-si (KR); Wonkyu Kwak, Yongin-si (KR); Jintae Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 253 days.

(21) Appl. No.: 18/500,645

(22) Filed: Nov. 2, 2023

(65) Prior Publication Data

US 2024/0074262 A1 Feb. 29, 2024

Related U.S. Application Data

(63) Continuation of application No. 17/164,090, filed on Feb. 1, 2021, now Pat. No. 11,825,707, which is a (Continued)

(30) Foreign Application Priority Data

Jul. 3, 2018 (KR) ........................ 10-2018-0077324

(51) Int. Cl.

*H10K 59/131* (2023.01)

*H10K 59/35* (2023.01)

(Continued)

(52) U.S. Cl.

CPC ......... *H10K 59/131* (2023.02); *H10K 59/351* (2023.02); *H10K 59/60* (2023.02); *H10K 59/8731* (2023.02)

(58) Field of Classification Search

CPC .... H10K 59/351; H10K 59/60; H10K 59/131; H10D 86/441

(Continued)

(56) References Cited

U.S. PATENT DOCUMENTS 8,890,181 B2 11/2014 Wang et al.

10,109,649 B2 10/2018 Jang (Continued)

FOREIGN PATENT DOCUMENTS

CN 107039493 8/2017

CN 107293567 10/2017

(Continued)

*Primary Examiner* — Ratisha Mehta

*Assistant Examiner* — Mikka Liu

(74) *Attorney, Agent, or Firm* — Sughrue Mion, PLLC

(57) ABSTRACT

A display panel includes a substrate having a first area and a second area, a non-display area surrounding the first area and the second area, and a display area surrounding the non-display area, a plurality of display elements arranged in the display area, and a plurality of signal lines electrically connected to the plurality of display elements, wherein the plurality of signal lines includes a first signal line and a second signal line neighboring each other and extending in a first direction, wherein the first signal line bypasses in the non-display area along a first side of the first area, and the second signal line bypasses in the non-display area along a second side of the first area, and wherein the first and second signal lines are asymmetrical with respect to a virtual central line through a center of the first area in the first direction.

31 Claims, 19 Drawing Sheets

Related U.S. Application Data continuation of application No. 16/360,148, filed on Mar. 21, 2019, now Pat. No. 10,910,461.

(51) Int. Cl.
*H10K 59/60* (2023.01)
*H10K 59/80* (2023.01)

(58) Field of Classification Search
USPC ................................................ 257/40, 88–89
See application file for complete search history.

(56) References Cited

U.S. PATENT DOCUMENTS

| | | | |
|---|---|---|---|
| 2006/0244741 A1 | 11/2006 | Kimura et al. | |
| 2008/0225216 A1 | 9/2008 | Shimodaira | |
| 2013/0003006 A1 | 1/2013 | Wang et al. | |
| 2013/0258234 A1 | 10/2013 | Park et al. | |
| 2014/0197428 A1* | 7/2014 | Wang | G07F 17/3211 257/88 |
| 2017/0154566 A1 | 6/2017 | Ryoo et al. | |
| 2017/0162637 A1* | 6/2017 | Choi | H01L 21/28 |
| 2017/0294502 A1* | 10/2017 | Ka | H10K 71/00 |
| 2018/0076416 A1 | 3/2018 | Cho et al. | |
| 2018/0090718 A1 | 3/2018 | Lee et al. | |

FOREIGN PATENT DOCUMENTS

| | | |
|---|---|---|
| JP | 2014-134766 | 7/2014 |
| KR | 10-2008-0045637 | 5/2008 |
| KR | 10-2013-0109709 | 10/2013 |
| KR | 10-2017-0031850 | 3/2017 |
| KR | 10-2017-0064598 | 6/2017 |
| KR | 10-2017-0066767 | 6/2017 |
| KR | 10-2017-0117291 | 10/2017 |

* cited by examiner

FIG. 2C

DISPLAY PANEL AND DISPLAY DEVICE INCLUDING THE SAME

CROSS-REFERENCE TO RELATED APPLICATION(S)

This is a continuation application of U.S. patent application Ser. No. 17/164,090 filed Feb. 1, 2021, the disclosure of which is incorporated herein by reference in its entirety. U.S. patent application Ser. No. 17/164,090 is a continuation application of U.S. patent application Ser. No. 16/360,148 filed Mar. 21, 2019, now U.S. Pat. No. 10,910,461 issued Feb. 2, 2021, the disclosure of which is incorporated herein by reference in its entirety. U.S. patent application Ser. No. 16/360,148 claims priority to and benefits of Korean Patent Application 10-2018-0077324 under 35 U.S.C. § 119, filed Jul. 3, 2018, in the Korean Intellectual Property Office, the entire contents of which are incorporated herein by reference.

BACKGROUND

1. Field

One or more embodiments relate to a display panel and a display device including the display panel.

2. Description of the Related Art

Recently, the use of display devices has become diversified. In addition, display devices are becoming thinner and more lightweight, and thus the range of use thereof is increasing. As display devices are used for various purposes, there may be various methods to design a shape of display devices, and also, functions that are connectable or linkable to the display devices are also increasing.

SUMMARY

According to one or more embodiments, a display panel may include a substrate including a first area and a second area, a non-display area surrounding the first area and the second area, and a display area surrounding the non-display area, a plurality of display elements arranged in the display area, and a plurality of signal lines electrically connected to the plurality of display elements, wherein the plurality of signal lines includes a first signal line and a second signal line neighboring the first signal line, the first and second signal lines respectively extending in a first direction, wherein the first signal line bypasses in the non-display area along a first side of the first area, and the second signal line bypasses in the non-display area along a second side of the first area, wherein the first signal line and the second signal line are asymmetrical with respect to a virtual central line passing through a center of the first area in the first direction.

A circuitous portion of the first signal line may be located at the first side of the first area, and a circuitous portion of the second signal line may be located at the second side of the first area.

A length of the circuitous portion of the first signal line may be different from a length of the circuitous portion of the second signal line.

A central angle of the circuitous portion of the first signal line may be different from a central angle of the circuitous portion of the second signal line.

The first area and the second area may be arranged in a second direction crossing the first direction.

A first width between the first area and the second area in the second direction may be greater than a sum of a second width between a first edge of the non-display area and the first area and a third width between a second edge of the non-display area and the second area along the second direction.

Signal lines located between the first area and the second area from among the plurality of signal lines may be alternately located over and under an insulating layer with the insulating layer therebetween.

The plurality of signal lines may include data lines or scan lines.

The display panel may further include an encapsulation member covering the plurality of display elements, wherein the encapsulation member includes a through hole corresponding to at least one of the first area and the second area.

The substrate may include a through hole corresponding to at least one of the first area and the second area.

According to one or more embodiments, a display device may include a substrate including a first area and a second area, a non-display area surrounding the first area and the second area, and a display area surrounding the non-display area, a plurality of display elements arranged in the display area, a plurality of signal lines electrically connected to the plurality of display elements, an encapsulation member covering the plurality of display elements, and an electronic element corresponding to at least one of the first area and the second area, wherein the plurality of signal lines includes a first signal line and a second signal line neighboring the first signal line, the first and second signal lines respectively extending in a first direction, wherein the first signal line bypasses in the non-display area along a first side of the first area, and the second signal line bypasses in the non-display area along a second side of the first area, wherein the first signal line and the second signal line are asymmetrical with respect to a virtual central line passing through a center of the first area in the first direction.

A circuitous portion of the first signal line may be located at the first side of the first area, and a circuitous portion of the second signal line may be located at the second side of the first area.

One of a length and a central angle of the circuitous portion of the first signal line may be different from that of the circuitous portion of the second signal line.

The first area and the second area may be arranged in a second direction crossing the first direction, wherein a first width between the first area and the second area along the second direction is greater than a sum of a second width between a first edge of the non-display area and the first area and a third width between a second edge of the non-display area and the second area along the second direction.

At least one of the substrate and the encapsulation member may include a through hole corresponding to at least one of the first area and the second area.

Signal lines passing over the non-display area from among the plurality of signal lines may include signal lines that are adjacent to each other and arranged on and under an insulating layer.

The electronic element may output or receive light or sound.

The electronic element may include at least one of a light sensor, a distance sensor, a fingerprint sensor, a speaker, and a camera.

The substrate may further include at least one third area between the first area and the second area.

According to one or more embodiments, a display panel may include a substrate including a first area and a second area arranged in a first direction, a non-display area surrounding the first area and the second area, and a display area surrounding the non-display area, a plurality of display elements arranged in the display area, and a plurality of signal lines extending in a second direction crossing the first direction and electrically connected to the plurality of display elements, wherein a number of signal lines between the first area and the second area in the non-display area is greater than a sum of a number of signal lines between a first edge of the non-display area and the first area and a number of signal lines between a second edge of the non-display area and the second area.

A first width between the first area and the second area may be greater than a sum of a second width between the first edge of the non-display area and the first area and a third width between the second edge of the non-display area and the second area.

The plurality of signal lines may include a first signal line and a second signal line neighboring the first signal line, wherein the first signal line and the second signal line extend in the second direction, and bypass in opposite directions with respect to each other in the non-display area at a first point adjacent to the first area.

The first signal line and the second signal line may be asymmetrical with respect to a virtual central line passing through a center of the first area in the first direction.

One of a length and a central angle of a circuitous portion of the first signal line may be different from that of a circuitous portion of the second signal line.

Signal lines passing over the non-display area from among the plurality of signal lines may include signal lines that are adjacent to each other and arranged on and under an insulating layer.

BRIEF DESCRIPTION OF THE DRAWINGS

Features will become apparent to those of skill in the art by describing in detail exemplary embodiments with reference to the attached drawings, in which:

FIGS. 2A through 2C illustrate cross-sectional views of a display device according to embodiments;

DETAILED DESCRIPTION

Figure 1:
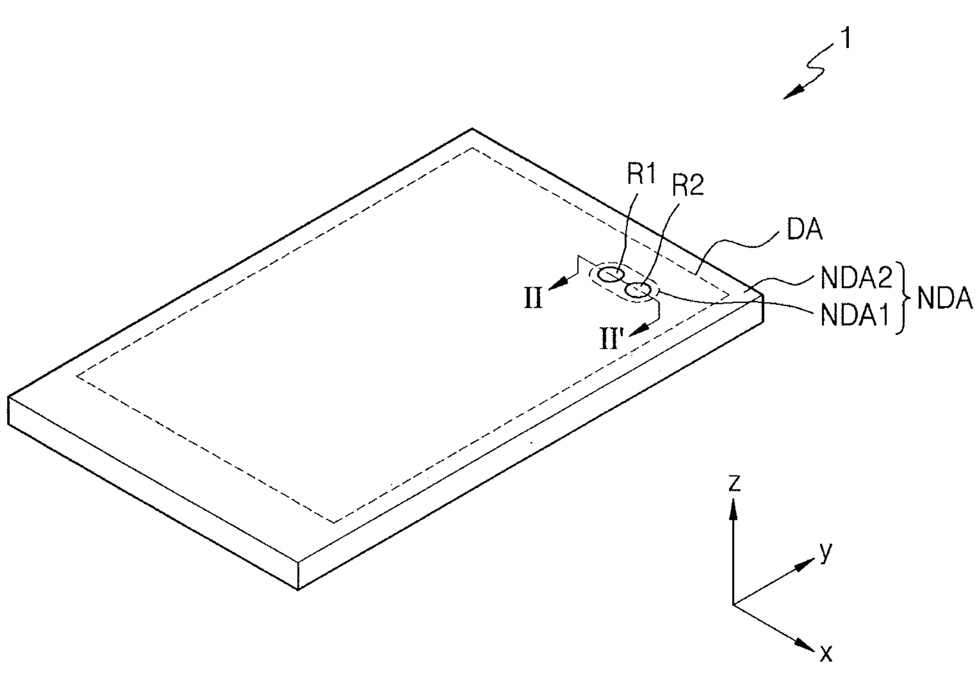
FIG. 1 illustrates a perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, while such terms as "first," "second," etc., may be used to describe various components, such components must not be limited to the above terms. The above terms are used only to distinguish one component from another. It will further be understood that an expression used in the singular encompasses the expression of the plural, unless it has a clearly different meaning in the context. Also, in the embodiments below, it will be further understood that the terms "comprise" and/or "have" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

In the embodiments below, when a layer, an area, or an element is "connected", it may be construed that the layer, area, or element is connected not only directly but also through other constituent elements interposed therebetween. For example, when a layer, an area, an element, or the like is described as being connected or electrically connected, the layer, the area, the element, or the like may be not only directly connected or directly electrically connected, but also through another layer, area, element, or the like interposed therebetween.

As used herein, the term "and/or" includes any and all combinations of one or more of the associated listed items. Expressions such as "at least one of," when preceding a list of elements, modify the entire list of elements and do not modify the individual elements of the list.

FIG. 1 is a perspective view schematically illustrating a display device 1 according to an embodiment.

Referring to FIG. 1, the display device 1 may include a display area DA, i.e., an area from which light is emitted, and a non-display area NDA, i.e., an area emitting no light. The display device 1 may provide, e.g., display, an image via the display area DA. The display device 1 may include, e.g., a liquid crystal display device, an electrophoretic display device, an organic light emitting display device, an inorganic light emitting display device, a quantum dot light emitting display device, a field emission display device, a surfaceconduction electron-emitter display device, a plasma display device, a cathode ray display device, or the like. Hereinafter, an organic light-emitting display device will be described as an example of the display device 1 according to an embodiment, but the display device 1 according to the present disclosure is not limited thereto, and various other display devices may be used.

As illustrated in FIG. 1, the display device 1 includes a first area R1 and a second area R2. The first area R1 and the second area R2 are locations where electronic elements (described in more detail below) may be arranged. The first area R1 and the second area R2 may be understood as a transmission area through which light and/or sound that are output from an electronic element to the outside or that travel from the outside into the electronic element may be transmitted. While two transmission areas, i.e., the first area R1 and the second area R2, are illustrated in FIG. 1, the present disclosure is not limited thereto, and three or more transmission areas may also be included. According to an embodiment, when light is transmitted through the first area R1 and the second area R2, a light transmittivity of the first area R1 and the second area R2 may be about 50% or higher, e.g., about 70% or higher, about 75% or higher, about 80% or higher, or about 85% or higher.

As further illustrated in FIG. 1, the non-display area NDA may include a first non-display area NDA1 surrounding the first area R1 and the second area R2, and a second non-display area NDA2 surrounding an outer portion of the display area DA. The first non-display area NDA1 may, e.g., continuously, surround, e.g., an entire perimeter of, the first area R1 and the second area R2 combined, the display area DA may, e.g., continuously, surround, e.g., an entire perimeter of, the first non-display area NDA1 overall, and the second non-display area NDA2 may surround, e.g., an entire perimeter of, the display area DA overall.

Figure 2A:
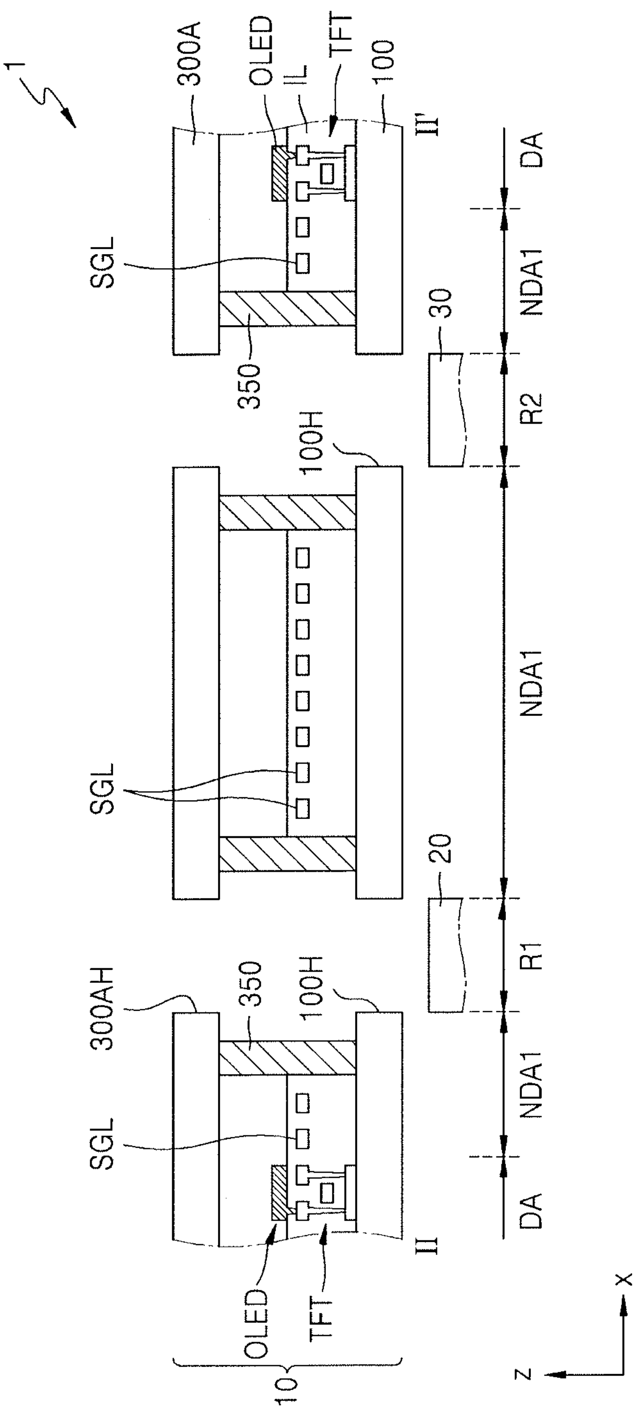
Figure 2B:
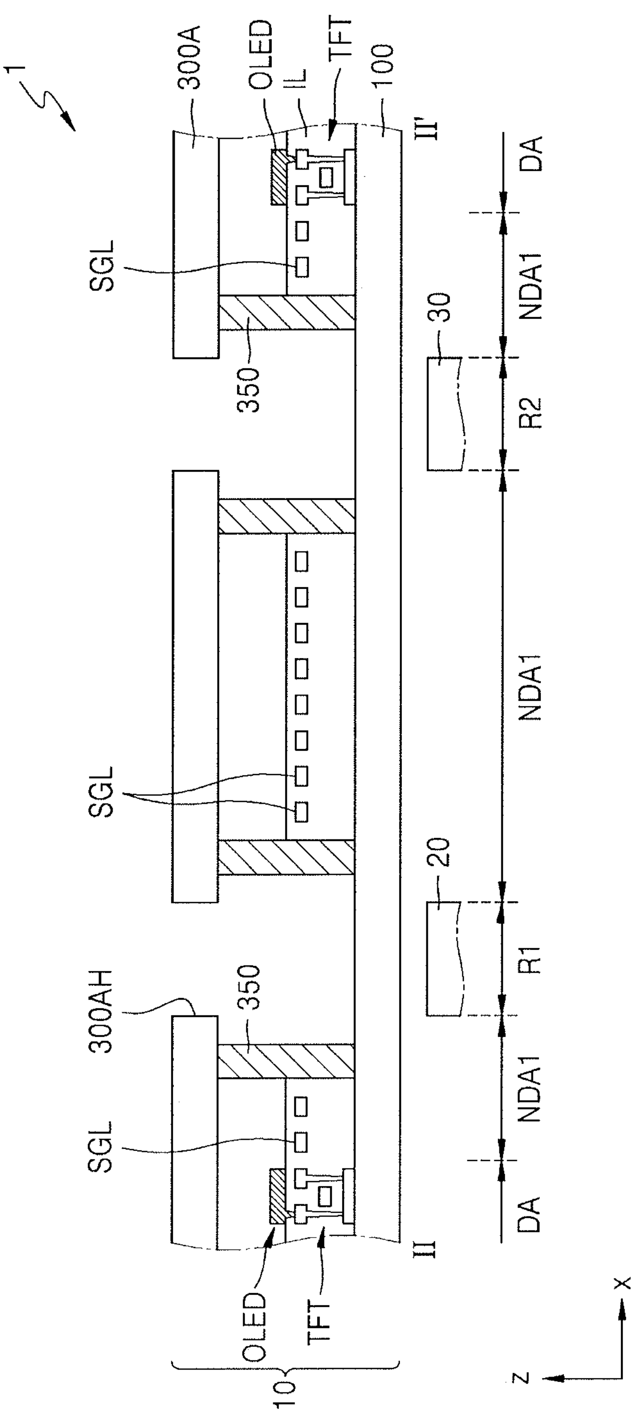
Figure 2C:
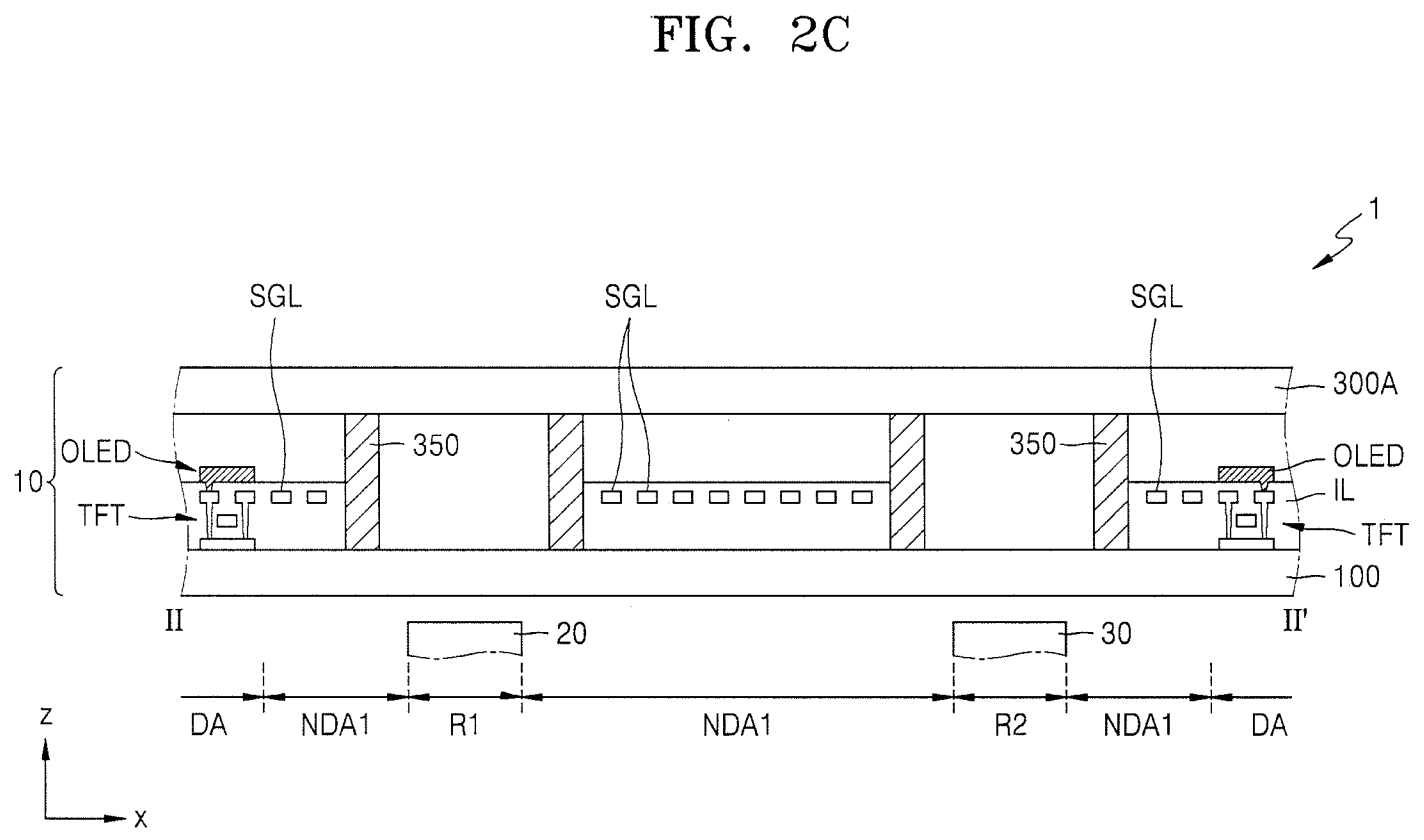

FIGS. 2A through 2C are cross-sectional views along line II-IT of FIG. 1.

Figure 4:
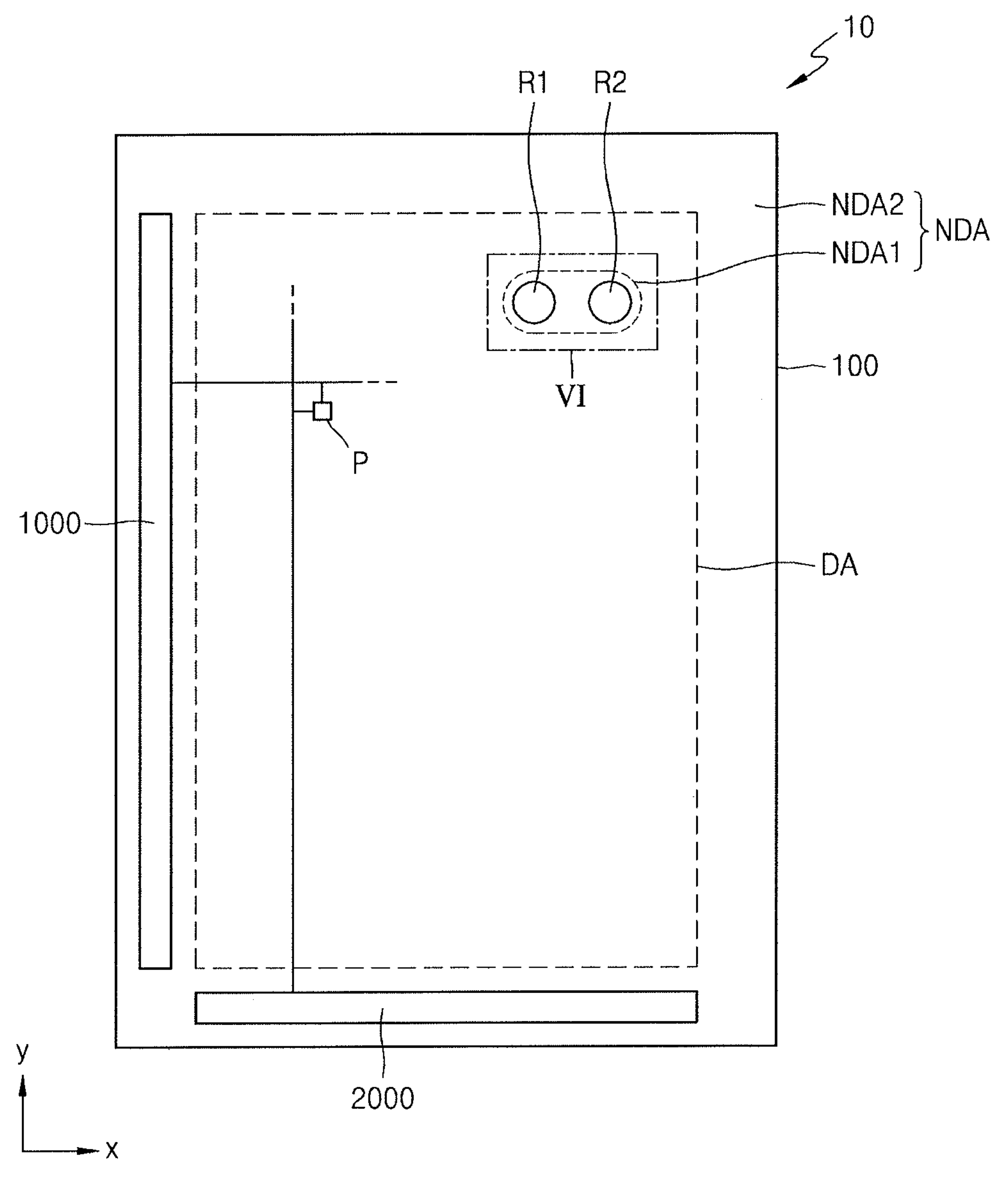
FIG. 4 illustrates a perspective view of a display device according to an embodiment.

Referring to FIG. 2A, the display device 1 may include a display panel 10 including display elements, e.g., pixels P in FIG. 4, and first and second electronic elements 20 and 30 respectively corresponding to the first and second areas R1 and R2. Although not illustrated in the drawings, elements such as an input sensing member sensing a touch input, an anti-reflective member including a polarizer and a retarder or a color filter and a black matrix, and a transparent window may be further arranged on the display panel 10.

The display panel 10 may include a substrate 100, an encapsulation substrate 300A as an encapsulation member that faces the substrate 100, and a sealing member 350 therebetween.

The substrate 100 may include, e.g., glass or a polymer resin. The polymer resin may be, e.g., polyether sulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose acetate propionate (CAP), or the like. The substrate 100 including a polymer resin may be flexible, rollable, or bendable. The substrate 100 may have a multi-layer structure including a layer including the above-described polymer resin and an inorganic layer. The encapsulation substrate 300A may include, e.g., glass or the above-described polymer resin.

A thin film transistor TFT and an organic light-emitting diode OLED connected to the thin film transistor TFT as a display element may be arranged in the display area DA of the substrate 100. Signal lines SGL are arranged in the first non-display area NDA1 of the substrate 100. A predefined signal, e.g., a data signal, a scan signal, or the like, may be provided to display elements that are spaced apart from each other in a y-direction with respect to the first and second areas R1 and R2 via the signal lines SGL.

The display panel 10 may include through holes corresponding to, e.g., overlapping, the first and second areas R1 and R2, respectively. For example, the substrate 100 and the encapsulation substrate 300A may respectively include through holes 100H and 300AH corresponding to, e.g., overlapping, the first and second areas R1 and R2, and an insulating layer IL or elements between the substrate 100 and the encapsulation substrate 300A corresponding to, e.g., overlapping, the first and second areas R1 and R2 may also be completely removed. While FIG. 2A illustrates the sealing member 350 arranged on both sides of the first and second areas R1 and R2, when viewed in a direction perpendicular to a main surface of the substrate 100, the first and second areas R1 and R2 may be respectively regarded as being entirely surrounded by the sealing member 350.

The first and second electronic elements 20 and 30 may be respectively located in the first and second areas R1 and R2. The first and second electronic elements 20 and 30 may be electronic elements that use light or sound. For example, the electronic elements may be a sensor that is used by receiving light, e.g., an infrared sensor, a camera receiving light to capture an image, a sensor measuring a distance or sensing a fingerprint by outputting or sensing light or sound, a compact lamp outputting light, a speaker outputting sound, and the like. An electronic element using light may use light of various wavelength bands, e.g., visible light, infrared light, and ultraviolet light.

When the display panel 10 includes through holes corresponding to the first and second areas R1 and R2 as illustrated in FIG. 2A, light or sound output by or received by the first and second electronic elements 20 and 30 may be used effectively.

Unlike the display panel 10 of FIG. 2A having through holes corresponding to the first and second areas R1 and R2, some elements of the display panel 10 may not include a through hole. For example, as illustrated in FIG. 2B, the encapsulation substrate 300A may include a through hole 300AH corresponding to, e.g., each of, the first and second areas R1 and R2, but the substrate 100 may have no through hole. In another example, as illustrated in FIG. 2C, both the substrate 100 and the encapsulation substrate 300A may not include through holes corresponding to the first and second areas R1 and R2. Even when the substrate 100 does not include the through hole 100H as illustrated in FIGS. 2B and 2C, light transmittivity for the first and second electronic elements 20 and 30 may be ensured by removing the insulating layer IL or elements between the substrate 100 and the encapsulation substrate 300A corresponding to the first and second areas R1 and R2. When the display device 1 includes the display panel 10 illustrated in FIGS. 2B and 2C, an electronic element that uses light may be used as the first and second electronic elements 20 and 30.

Figure 3A:
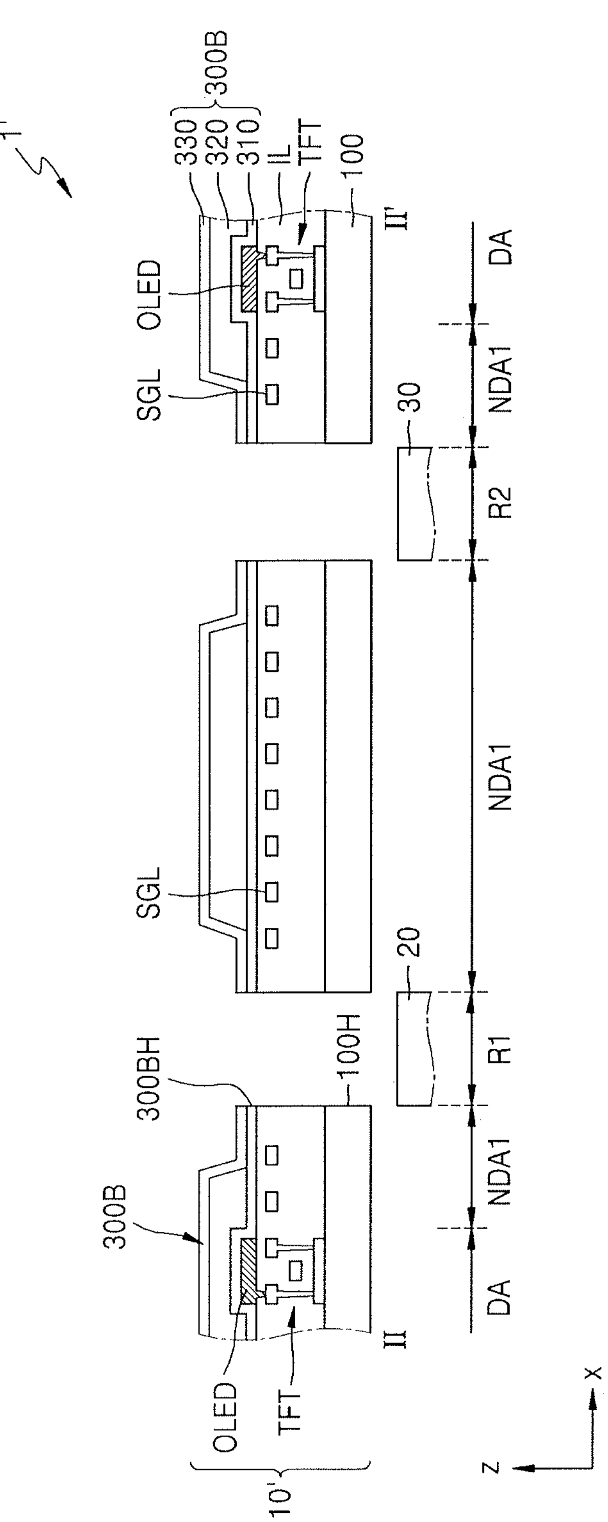
FIGS. 3A through 3C illustrate cross-sectional views of a display device according to other embodiments.
Figure 3B:
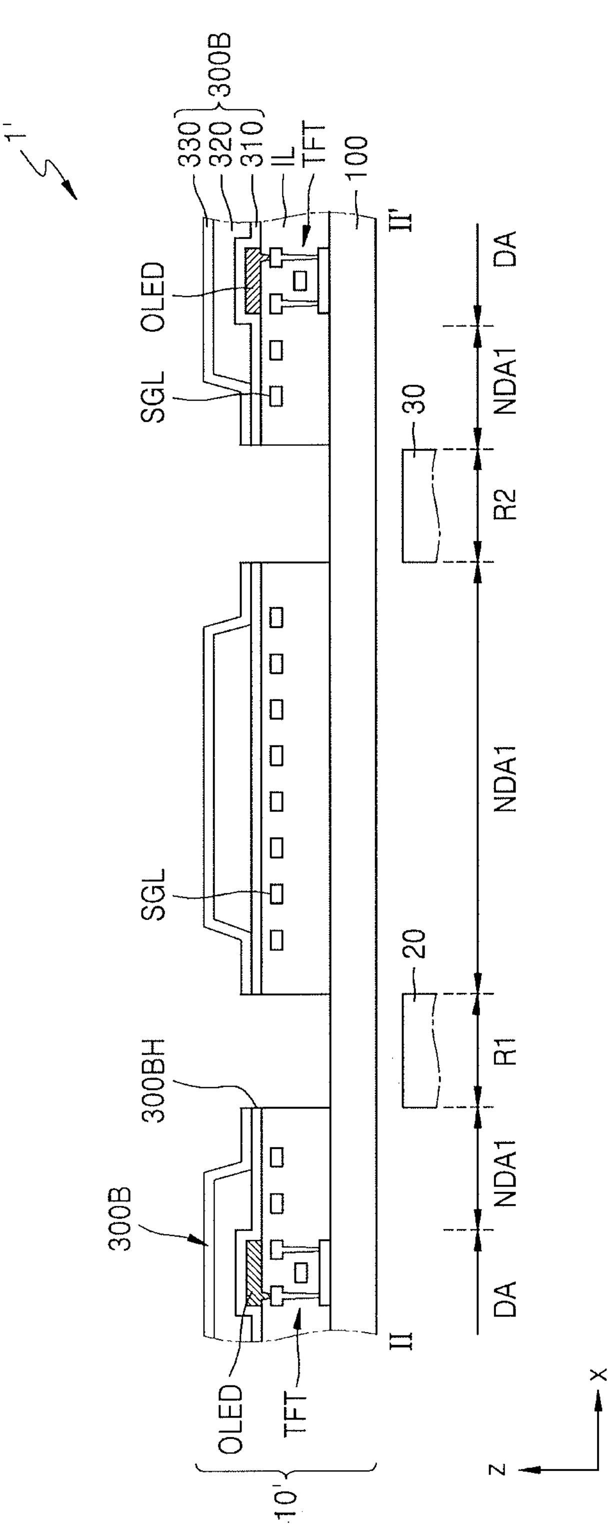
Figure 3C:
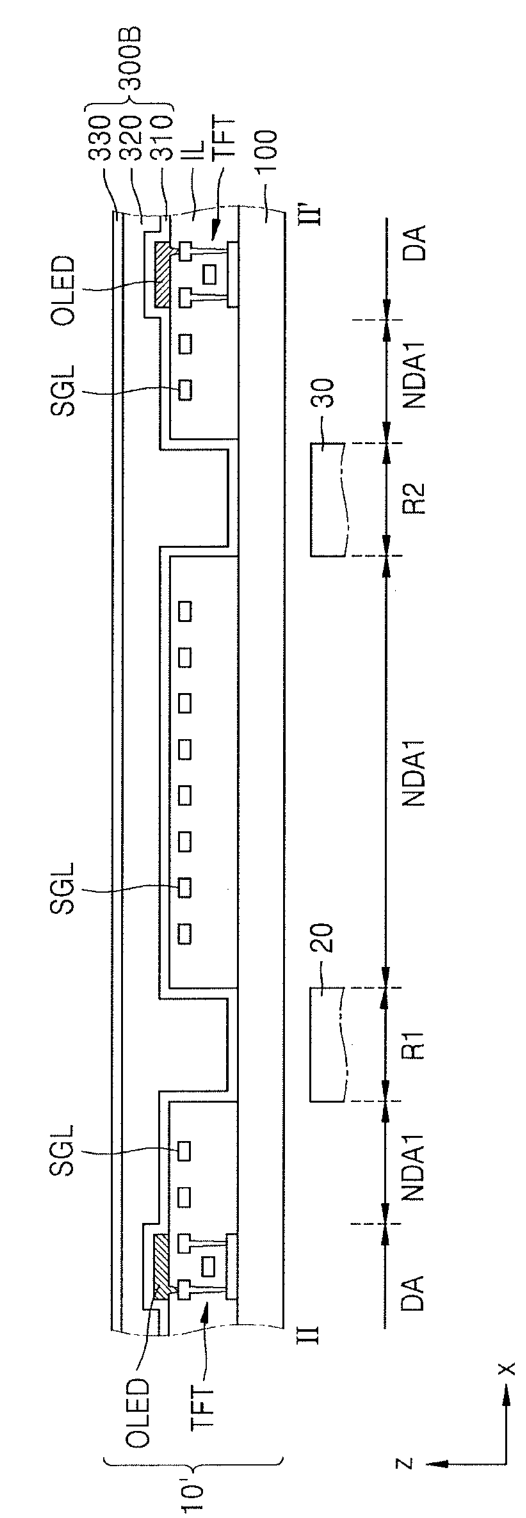

FIGS. 3A through 3C are cross-sectional views schematically illustrating a display device 1' according to other embodiments, and may correspond to the cross-section along line II-II' of FIG. 1.

Referring to FIG. 3A, like the display device 1 described above with reference to FIG. 2A, the display device 1' may include a display panel 10' including display elements and the first and second electronic elements 20 and 30 respectively corresponding to first and second areas R1 and R2 of the display panel 10. In addition, the display device 1' may further include, on the display panel 10', an input sensing member sensing a touch input, an anti-reflective member, a window, or the like.

The display panel 10' according to the present embodiment may include a thin film encapsulation layer 300B, which in this case may further enhance the flexibility of the display panel 10'. For example, the thin film encapsulation layer 300B of the display panel 10' may be thinner and more flexible than the encapsulation substrate 300A of the display panel 10 in FIGS. 2A-2C. Hereinafter, description will focus on differences for convenience of description.

The thin film encapsulation layer 300B may include at least one inorganic encapsulation layer and at least one organic encapsulation layer. In this regard, FIG. 3A further illustrates first and second inorganic encapsulation layers 310 and 330 and an organic encapsulation layer 320 therebetween.

The first and second inorganic encapsulation layers 310 and 330 may include at least one inorganic insulating material, e.g., an aluminum oxide, a titanium oxide, a tantalum oxide, a hafnium oxide, a zinc oxide, a silicon oxide, a silicon nitride, and a silicon oxynitride. The organic encapsulation layer 320 may include a polymer-based material, e.g., an acrylic resin, an epoxy-based resin, PI, and polyethylene.

The display panel 10' may include through holes corresponding to, e.g., overlapping, the first and second areas R1 and R2. For example, the substrate 100 and the thin film encapsulation layer 300B may include through holes 100H and 300BH respectively corresponding to the first and second areas R1 and R2. The first and second electronic elements 20 and 30 that use light or sound may also be arranged in the first and second areas R1 and R2 as described above.

Referring to FIG. 3B, unlike the display panel 10' of FIG. 3A having through holes in the substrate 100 corresponding to the first and second areas R1 and R2, the thin film encapsulation layer 300B may include a through hole 300BH corresponding to the first and second areas R1 and R2, while the substrate 100 may have no through holes. Further, as illustrated in FIG. 3C, both the substrate 100 and the thin film encapsulation layer 300B may not include through holes corresponding to the first and second areas R1 and R2. Even when the substrate 100 does not include a through hole 100H, light transmittivity for the first and second electronic elements 20 and 30 may be ensured by removing an insulating layer IL or elements between the substrate 100 and the thin film encapsulation layer 300B corresponding to the first and second areas R1 and R2.

When the thin film encapsulation layer 300B includes the through hole 300BH as illustrated in FIGS. 3A and 3B, each of at least one inorganic encapsulation layer and at least one organic encapsulation layer may include a hole corresponding to the through hole 300BH. The hole of the organic encapsulation layer may be larger than the hole of the at least one inorganic encapsulation layer such that the first and second inorganic encapsulation layers 310 and 330 may directly contact each other around the first and second areas R1 and R2.

When the thin film encapsulation layer 300B does not include a through hole, as illustrated in FIG. 3C, each of at least one inorganic encapsulation layer and at least one organic encapsulation layer may cover the first and second areas R1 and R2. In this case, a portion of the insulating layer IL between the substrate 100 and the thin film encapsulation layer 300B may be removed. While FIG. 3A illustrates that the insulating layer IL corresponding to the first and second areas R1 and R2 is completely removed, only some layers of the insulating layer IL, which is a multi-layer, may be removed.

Figure 5:
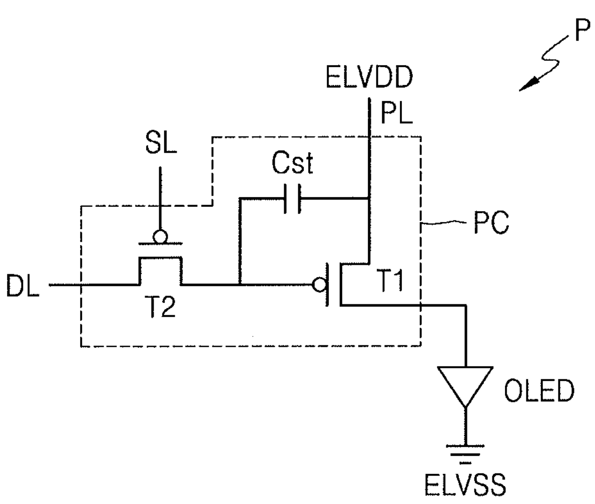
FIG. 5 illustrates a schematic equivalent circuit diagram of a pixel of a display panel according to an embodiment.

FIG. 4 is a plan view schematically illustrating the display panel 10 according to an embodiment, and FIG. 5 is an equivalent circuit diagram schematically illustrating a pixel of the display panel 10.

Referring to FIG. 4, the display panel 10 may include a plurality of pixels P arranged in the display area DA. Each of the pixels P may include a display element such as an organic light-emitting diode OLED. The pixels P may emit light of a red color, a green color, a blue color, or a white color, through the organic light-emitting diode OLED. In the present specification, the pixels P may be understood as pixels that each emit light of any one color from among a red color, a green color, a blue color, and a white color as described above. The display area DA may be covered by the encapsulation member described above with reference to FIGS. 2A through 3C and protected from external air or moisture.

Referring to FIG. 5, each pixel P includes a pixel circuit PC and the organic light-emitting diode OLED connected to the pixel circuit PC. The pixel circuit PC may include a first thin film transistor T1, a second thin film transistor T2, and a storage capacitor Cst.

The second thin film transistor T2 is a switching thin film transistor and is connected to a scan line SL and a data line DL, and transfers a data voltage input via the data line DL according to a switching voltage input via the scan line SL to the first thin film transistor T1. The storage capacitor Cst is connected to the second thin film transistor T2 and a driving voltage line PL, and stores a voltage corresponding to a difference between a voltage received from the second thin film transistor T2 and a first power voltage ELVDD supplied to the driving voltage line PL.

The first thin film transistor T1 is a driving thin film transistor and is connected to the driving voltage line PL and the storage capacitor Cst, and may control a driving current flowing through the organic light-emitting diode OLED from the driving voltage line PL, in accordance with a voltage value stored in the storage capacitor Cst. The organic light-emitting diode OLED may emit light having a predefined brightness via a driving current. An opposite electrode (e.g., a cathode) of the organic light-emitting diode OLED may receive a second power voltage ELVSS.

FIG. 5 illustrates that the pixel circuit PC includes two thin film transistors and one storage capacitor, but the present disclosure is not limited thereto. For example, the number of thin film transistors and the number of storage capacitors may differ according to a design of the pixel circuit PC.

Referring back to FIG. 4, the first non-display area NDA1 simultaneously surrounds both the first and second areas R1 and R2. For example, the first non-display area NDA1 may be between the display area DA and the first and second areas R1 and R2 (i.e., within the dashed circle of FIG. 4 and around the first and second areas R1 and R2). The first non-display area NDA1 corresponds to an area passed by signal lines via which signals are provided to the pixels P included around the first non-display area NDA1, e.g., the first non-display area NDA1 accommodates signal lines connected to the pixels P in the display area DA surrounding the first non-display area NDA1.

The second non-display area NDA2 may include a scan driver 1000 providing a scan signal to each pixel P, a data driver 2000 providing a data signal to each pixel P, a main power wiring via which first and second power voltages ELVDD and ELVSS are provided, or the like.

FIG. 4 may be understood as the substrate 100 included in the display panel 10. For example, the substrate 100 includes the first and second areas R1 and R2, the display area DA, and the first and second non-display areas NDA1 and NDA2. Similarly, for example, the signal lines SGL of FIG. 2A may be understood as the signal lines arranged in the first non-display area NDA1 to be connected to the pixels P described with reference to FIG. 4.

Figure 6:
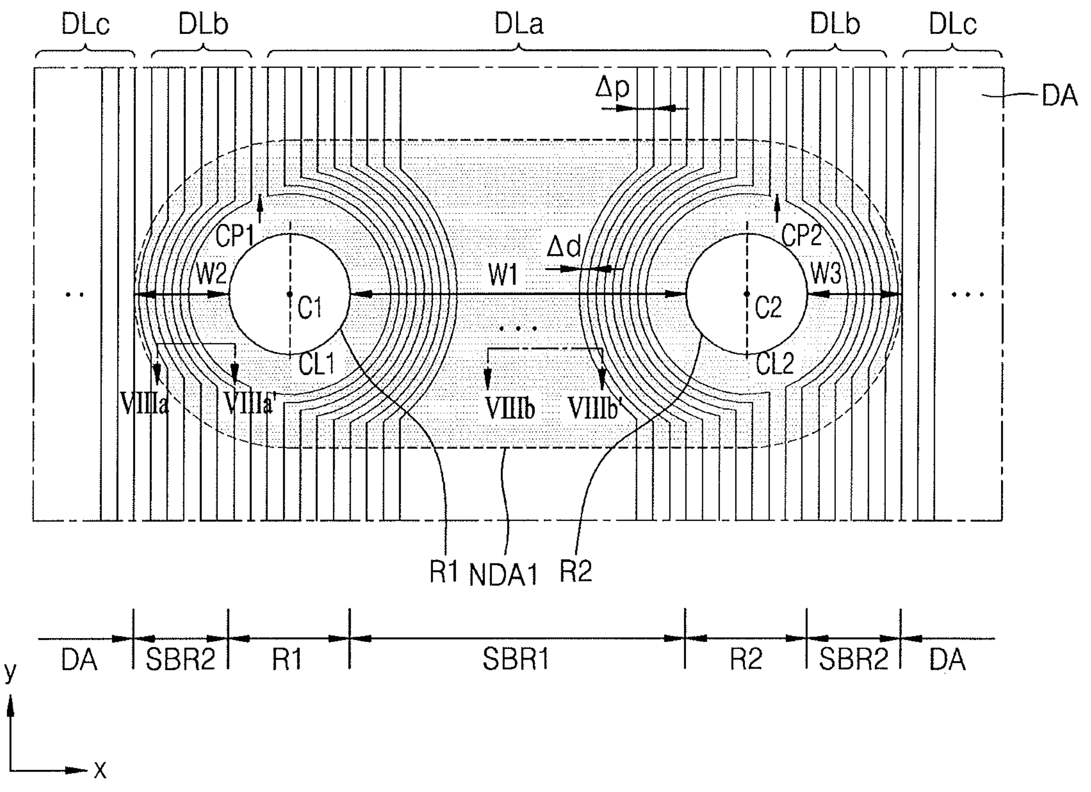
FIG. 6 illustrates a plan view of a portion of a display panel according to an embodiment.
Figure 7:
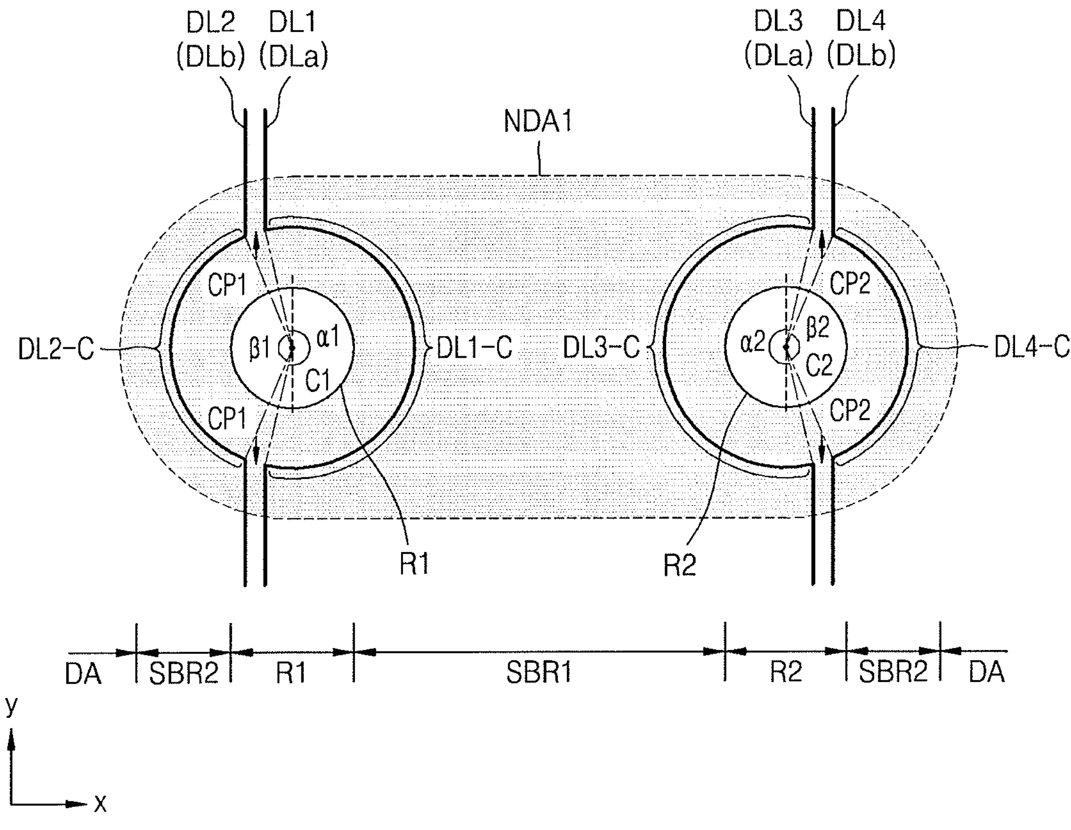
FIG. 7 illustrates an excerpt plan view of some signal lines of FIG. 6.

FIG. 6 is a plan view illustrating a portion of the display panel 10 according to an embodiment and corresponds to an enlarged view of region VI of FIG. 4. FIG. 7 is an excerpt plan view of some signal lines of FIG. 6.

Referring to FIGS. 6-7, the first area R1 and the second area R2 may be arranged in a first direction, e.g., adjacent to each other along the x-direction, and signal lines may extend in a second direction crossing the first direction, e.g., the signal lines may extend along the y-direction. In this regard, FIG. 6 illustrates that the first area R1 and the second area R2 are arranged in the x-direction, and data lines DLa, DLb, and DLc extend in the y-direction as signal lines.

Some data lines DLa and DLb may extend in the y-direction such that signals are provided to pixels located above and below the first non-display area NDA1 with respect to a XY plane and may detour, e.g., bypass, along an edge of the first area R1 or the second area R2 in the first non-display area NDA1. The other data lines DLc do not pass over the first non-display area NDA1 and may extend in the display area DA substantially in a straight line. The data lines DLa and DLb have a predefined pitch $\Delta p$ in the display area DA, and have a pitch $\Delta d$ that is less than the above-described pitch $\Delta p$ ($\Delta p > \Delta d$) in the first non-display area NDA1.

Hereinafter, for convenience of description, the data lines DLa, which pass over the first non-display area NDA1 in an area between the first area R1 and the second area R2 (i.e., a first sub-non-display area SBR1), will be called a first group, and the data lines DLb, which pass over the first non-display area NDA1 outside the first sub-non-display area SBR1, will be called a second group. The data lines DLb of the second group pass in an area between a first edge of the first non-display area NDA1 and an edge of the first area R1 and an area between a second edge of the first non-display area NDA1 and an edge of the second area R2, i.e., a second sub-non-display area SBR2.

When referring to an area around the first area R1 illustrated in FIG. 6, some of the data lines DLa of the first group bypass along a first side of the first area R1 (e.g., a right side of the first area R1 in FIG. 6), and some of the data lines DLb of the second group bypass along a second side of the first area R1 (e.g., a left side of the first area R1 in FIG. 6). The data lines DLa of the first group and the data lines DLb of the second group around the first area R1 bypass in opposite directions to each other at a first point CP1. The first point CP1 is not located on a first virtual line CL1 passing through a first center C1 of the first area R1 and extending in the y-direction. The first point CP1 is offset toward a side adjacent to a first edge of the first non-display area NDA1 with respect to the first virtual line CL1, e.g., the first point CP1 may be horizontally offset to the left along the x-direction in FIG. 6 with respect to the first virtual line CL1.

Referring to FIG. 6, the first point CP1 may be located on the left side with respect to the first virtual line CL1. The first point CP1 is spaced apart from the first virtual line CL1 by a predetermined distance. Thus, some data lines DLa and DLb that bypass along the edge of the first area R1 have an asymmetric shape with respect to the first virtual line CL1.

In detail, referring to FIG. 7, neighboring first and second data lines DL1 and DL2 that are adjacent to each other with respect to the first point CP1 bypass the first area R1 in opposite directions to each other. The first data line DL1 of FIG. 7 is one of the data lines DLa of the first group illustrated in FIG. 6, and the second data line DL2 is one of the data lines DLb of the second group illustrated in FIG. 6.

The first and second data lines DL1 and DL2 are asymmetrical with respect to the first virtual line CL1, and thus, one of the lengths and central angles of a first curved portion (circuitous portion, or bypass portion) DL1-C of the first data line DL1 may be different from that of a second curved portion (circuitous portion, or bypass portion) DL2-C of the second data line DL2. For example, a length of the first circuitous portion DL1-C, e.g., a portion of the first data line DL1 curving (or bypassing, detouring) along the right side of the first area R1 in FIG. 7, may be greater than a length of the second circuitous portion DL2-C, e.g., a portion of the second data line DL2 curving (or bypassing, detouring) along the left side of the first area R1 in FIG. 7. FIGS. 6 and 7 illustrate that each of the first and second circuitous portion DL1-C and DL2-C has an arc shape, e.g., an arc-based smooth curved shape, but present disclosure is not limited thereto. For example, each of the first and second circuitous portions DL1-C and DL2-C generally has an arc shape, but locally a zigzag or stepwise shape, etc. That is, each of the first and second circuitous portions DL1-C and DL2-C has an arc-based stepwise shape.

Therefore, a central angle $\alpha$1 of the first circuitous portion DL1-C may be greater than a central angle $\beta$1 of the second circuitous portion DL2-C. For example, as illustrated in FIG. 7, the central angle $\alpha$1 of the first circuitous portion DL1-C may be an angle between the dotted/dashed lines in FIG. 7 connected to the linear portions of the first data line DL1 on opposite sides of the first area R1, i.e., an angle larger than 180°, while the central angle (31 of the second circuitous portion DL2-C may be an angle between the dotted/dashed lines in FIG. 7 connected to the linear portions of the second data line DL2 on opposite sides of the first area R1, i.e., an angle smaller than 180°.

Similarly, when referring to an area around the second area R2 illustrated in FIG. 6, some of the data lines DLa of the first group bypass along a first side of the second area R2 (e.g. a left side of the second area R2 in FIG. 6), and some of the data lines DLb of the second group bypass along a second side of the second area R2 (e.g., a right side of the second area R2 of FIG. 6). The data lines DLa of the first group and the data lines DLb of the second group around the second area R2 bypass in opposite directions to each other at a second point CP2. The second point CP2 is not located on a second virtual line CL2 extending in the y-direction and passing through the second center C2 of the second area R2. The second point CP2 is offset toward a side adjacent to a second edge of the first non-display area NDA1 with respect to the second virtual line CL2, e.g., the second point CP2 may be horizontally offset to the right along the x-direction in FIG. 6 with respect to the second virtual line CL2.

Referring to FIG. 6, the second point CP2 is located on the right side with respect to the second virtual line CL2. The second point CP2 is spaced apart from the second virtual line CL2 by a predetermined distance. Thus, the data lines DLa and DLb that bypass along the edge of the second area R2 have an asymmetrical shape with respect to the second virtual line CL2.

In detail, referring to FIG. 7, third and fourth data lines DL3 and DL4 that are adjacent to each other with respect to the second point CP2 bypass in opposite directions to each other. The third data line DL3 of FIG. 7 is one of the data lines DLa of the first group illustrated in FIG. 6, and the fourth data line DL4 is one of the data lines DLb of the second group illustrated in FIG. 6.

The third and fourth data lines DL3 and DL4 are asymmetrical with respect to the second virtual line CL2, and thus, one of the lengths and central angles of a third curved portion (circuitous portion, or bypass portion) DL3-C of the third data line DL3 may be different from that of a fourth curved portion (circuitous portion, or bypass portion) DL4-C of the fourth data line DL4. For example, a length of the third circuitous portion DL3-C, e.g., a portion of the third data line DL3 curving along the left side of the second area R2 in FIG. 7, may be greater than a length of the fourth circuitous portion DL4-C, e.g., a portion of the fourth data line DL4 curving along the right side of the second area R2 in FIG. 7.

Therefore, a central angle $\alpha 2$ of the third circuitous portion DL3-C may be greater than a central angle $\beta 2$ of the fourth circuitous portion DL4-C. For example, as illustrated in FIG. 7, the central angle $\alpha 2$ of the third circuitous portion DL3-C may be an angle between the dotted/dashed lines in FIG. 7 connected to the linear portions of the third data line DL3 on opposite sides of the second area R2 i.e., an angle larger than 180°, while the central angle $\beta 2$ of the fourth circuitous portion DL4-C may be an angle between the dotted/dashed lines in FIG. 7 connected to the linear portions of the fourth data line DL4 on opposite sides of the second area R2, i.e., an angle smaller than 180°.

As illustrated in FIGS. 6 and 7, as the first and second points CP1 and CP2 are respectively offset from the first and second virtual lines CL1 and CL2 toward the edges of the first non-display area NDA1, relatively many data lines may be arranged in the first sub-non-display area SBR1 between the first area R1 and the second area R2, and relatively few data lines may be arranged in the second sub-non-display area SBR2. That is, a total number of data lines DLa of the first group arranged in the first sub-non-display area SBR1 may be greater than a total number of data lines DLb of the second group arranged in the second sub-non-display area SBR2.

As the number of data lines DLb arranged in the second sub-non-display area SBR2 may be reduced, an area of the second sub-non-display area SBR2 may also be reduced, e.g., as compared to an area of the first sub-non-display area SBR1. In this regard, FIG. 6 illustrates that a first width W1 between the first area R1 and the second area R2, e.g., along the x-direction, is greater than a sum of a second width W2 between the first edge of the first non-display area NDA1 and the first area R1 and a third width W3 between the second edge of the first non-display area NDA1 and the second area R2 (W1>W2+W3). The first width W1 may be regarded as a shortest width between the first area R1 and the second area R2, and the second width W2 may be regarded as a shortest width between the first edge of the first non-display area NDA1 and the first area R1, and the third width W3 may be regarded as a shortest width between the second edge of the first non-display area NDA1 and the second area R2. The first through third widths W1, W2, and W3 may be measured along a virtual line connecting the first center C1 and the second center C2.

Figure 8:
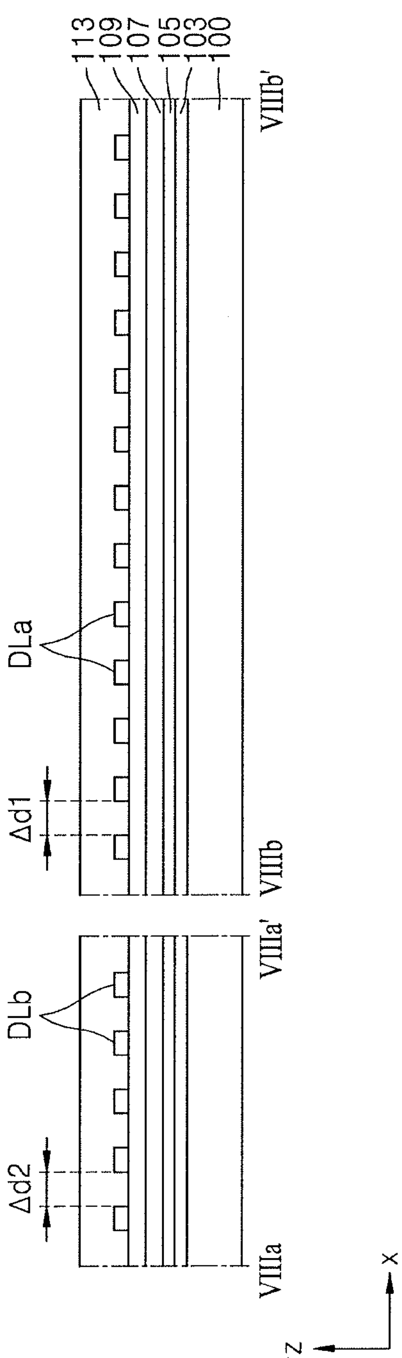
FIG. 8 illustrates a schematic cross-sectional view of data lines arranged in a first non-display area in a display panel according to an embodiment.

FIG. 8 is a schematic cross-sectional view illustrating the data lines DLa and DLb arranged in the first non-display area NDA1 according to an embodiment. FIG. 8 is a cross-section taken along lines VIIIa-VIIIa' and VIIIb-VIIIb' of FIG. 6.

Referring to FIG. 8, the data lines DLa of the first group and the data lines DLb of the second group are respectively arranged on insulating layers. For example, a plurality of insulating layers 103, 105, 107, and 109 and 113 may be stacked on the substrate 100, and the data lines DLa and DLb may be arranged on at least one of the insulating layers 103, 105, 107, and 109. The data lines DLa and DLb may be arranged on a same insulating layer, e.g., on a first insulating layer 109, and may be covered by a second insulating layer 113. Insulating layers 103, 105, 107, 109, and 113 may respectively include an inorganic insulating material, an organic insulating material, or a mixture of these materials.

The data lines DLa of the first group may be arranged to have a first pitch $\Delta d1$, and the data lines DLb of the second group may be arranged to have a second pitch $\Delta d2$. The first pitch $\Delta d1$ and the second pitch $\Delta d2$ may be identical or different.

Figure 9:
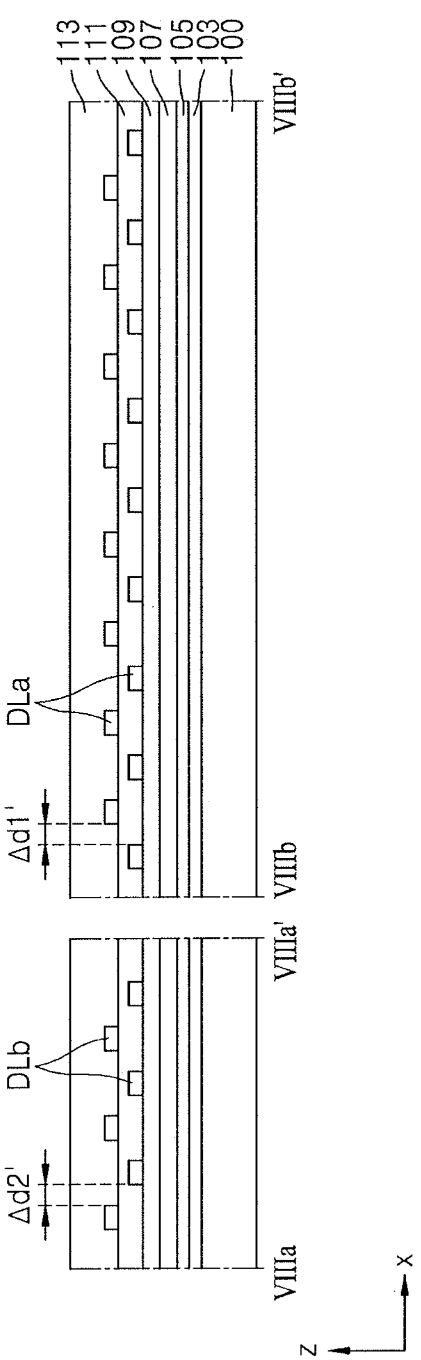
FIG. 9 illustrates a schematic cross-sectional view of data lines arranged in a first non-display area in a display panel according to another embodiment.

FIG. 9 is a schematic cross-sectional view illustrating the data lines DLa and DLb arranged in the first non-display area NDA1 according to another embodiment. FIG. 9 is a cross-section along lines VIIIa-VIIIa' and VIIIb-VIIIb' of FIG. 6.

Referring to FIG. 9, the data lines DLa of the first group and the data lines DLb of the second group are respectively arranged on insulating layers. The data lines DLa of the first group and the data lines DLb of the second group may be alternately arranged with an interlayer insulating layer 111 therebetween. For example, one of a neighboring data lines DLa of the first group may be arranged under the interlayer insulating layer 111, and another data line DLa may be arranged on the interlayer insulating layer 111. One of a neighboring data lines DLb of the second group may be arranged under the interlayer insulating layer 111, and another data line DLb may be arranged on the interlayer insulating layer 111. The interlayer insulating layer 111 may include an inorganic insulating material, an organic insulating material, or a mixture of these materials.

A first pitch $\Delta d1'$ between the data lines DLa of the first group may be less than the first pitch $\Delta d1$ described with reference to FIG. 8. Likewise, a second pitch $\Delta d2'$ between the data lines DLb of the second group may be less than the second pitch $\Delta d2$ described with reference to FIG. 8. When reducing a pitch between adjacent data lines, an area of the first non-display area NDA1 (see FIG. 6) may be further reduced. In FIG. 9, the first pitch $\Delta d1'$ and the second pitch $\Delta d2'$ may be identical or different.

Figure 10:
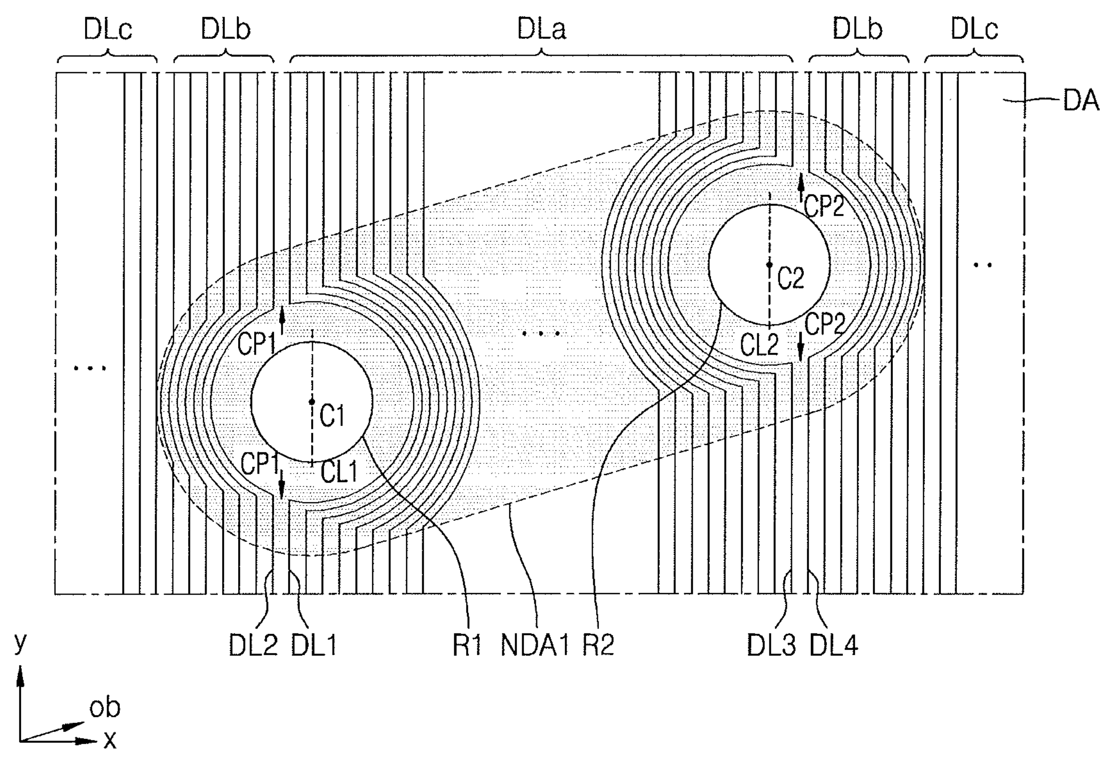
FIG. 10 illustrates an excerpt plan view of a portion of a display panel according to another embodiment.

FIG. 10 is an excerpt plan view illustrating a portion of a display panel according to another embodiment.

Referring to FIG. 10, there is a difference in that a direction of an arrangement of the first and second areas R1 and R2 described above with reference to FIG. 6 is along the x-direction, whereas a direction of an arrangement of the first and second areas R1 and R2 illustrated in FIG. 10 is along an ob-direction which is along an oblique direction with respect to the x-direction.

In detail, referring to FIG. 10, the data lines DLa of the first group and the data lines DLb of the second group extend in the y-direction crossing the ob-direction which is an arrangement direction of the first and second areas R1 and R2 and may bypass in the first non-display area NDA1 along edges of the first and second areas R1 and R2. The first data line DL1 of the first group and the second data line DL2 of the second group that are adjacent to each other with respect to the first area R1 bypass along the first side and the second side of the first area R1 at the first point CP1. Likewise, the third data line DL3 of the first group and the fourth data line DL4 of the second group that are adjacent to each other with respect to the second area R2 bypass along the first side and the second side of the second area R2 at the second point CP2. All the other characteristics except that the first and second areas R1 and R2 are arranged in an oblique direction are the same as those descriptions provided above with reference to FIGS. 6 through 9, and thus will not be repeated.

In the embodiments described with reference to FIGS. 1 through 10, description is focused on two transmission areas corresponding to electronic elements, i.e., the first area R1 and the second area R2, but the present disclosure is not limited thereto.

FIGS. 11 through 14 are excerpt plan views illustrating a portion of a display panel according to another embodiment. Embodiments to be described below with reference to FIGS. 11 through 14 also include characteristics described above with reference to FIGS. 1 through 10 and characteristics derived therefrom, and thus description below will focus on differences.

Figure 11:
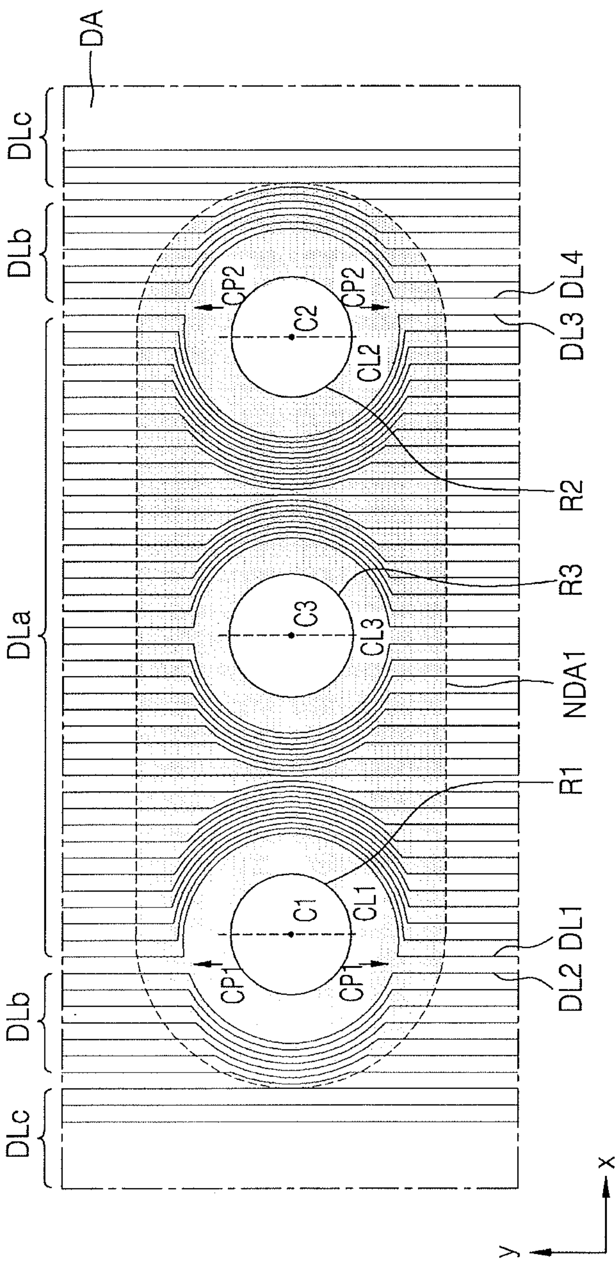
FIGS. 11 through 14 illustrate excerpt plan views of a portion of a display panel according to another embodiment.

Referring to FIG. 11, a third area R3 may be further included between the first and second areas R1 and R2. A detailed cross-sectional structure with respect to the third area R3 may be identical to those with respect to the first and second areas R1 and R2 described with reference to FIGS. 2A through 3C. When the display panel further includes the third area R3, some of the data lines DLa arranged between the first area R1 and the second area R2 detour, e.g., bypass, the third area R3 and may be symmetrical to each other with respect to a third virtual line CL3 that passes a third center C3. Meanwhile, the other data lines from among the data lines DLa arranged between the first area R1 and the second area R2 may extend by detouring, e.g., bypassing, the first area R1 and the second area R2. A pitch of data lines arranged in an area between the first center C1 and the second center C2, e.g., a pitch between circuitous portions, may be less than a pitch between data lines in the display area DA ($\Delta p > \Delta d$, see FIG. 6) as described above with reference to FIG. 6. In addition, also in the embodiment illustrated in FIG. 11, the first point CP1 and the second point CP2 are also respectively spaced apart from the first and second virtual lines CL1 and CL2 as described above.

FIG. 11 illustrates that one third area R3 is arranged between the first area R1 and the second area R2, but the present disclosure is not limited thereto. According to another embodiment, a plurality of third areas R3 may be arranged between the first area R1 and the second area R2.

Figure 12:
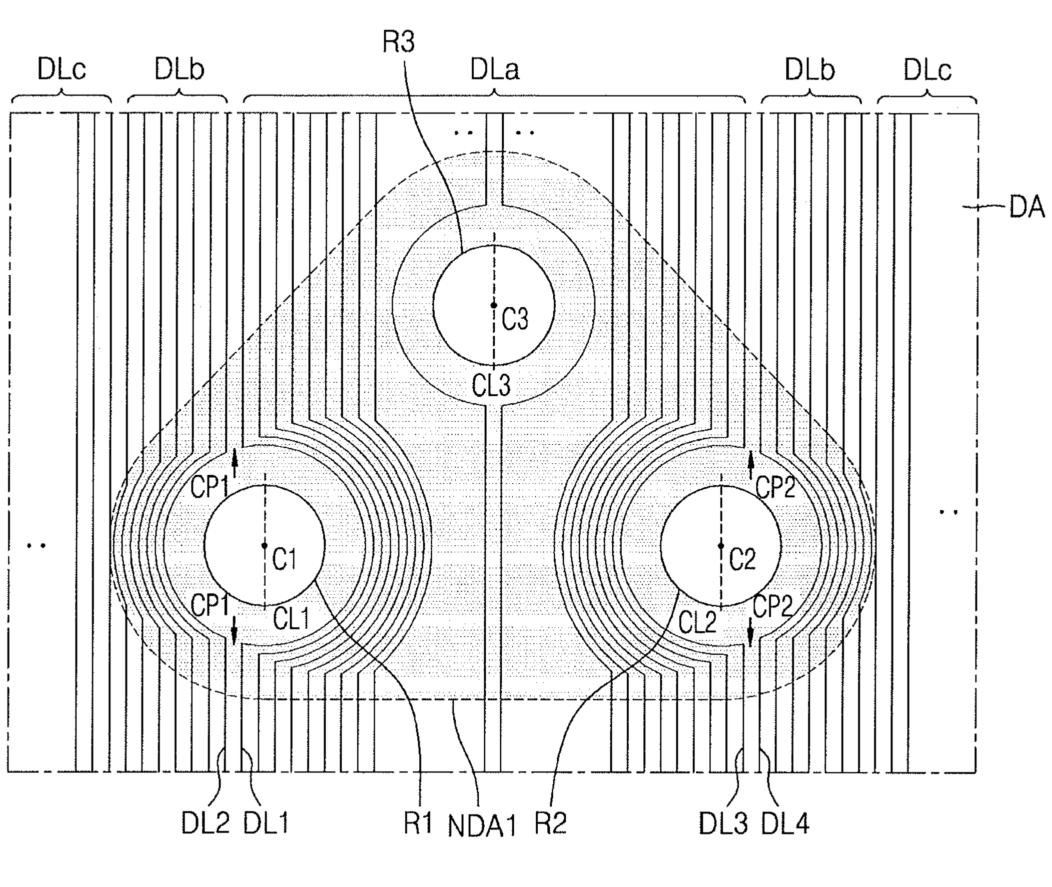
Figure 12:
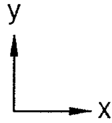

FIG. 11 illustrates that the third area R3 is arranged directly between the first area R1 and the second area R2 in the x-direction, but the present disclosure is not limited thereto. As illustrated in FIG. 12, the third area R3 may be spaced apart from the first area R1 and the second area R2 in the y-direction by a predetermined distance and be arranged between the first area R1 and the second area R2 in the x-direction.

Figure 13:
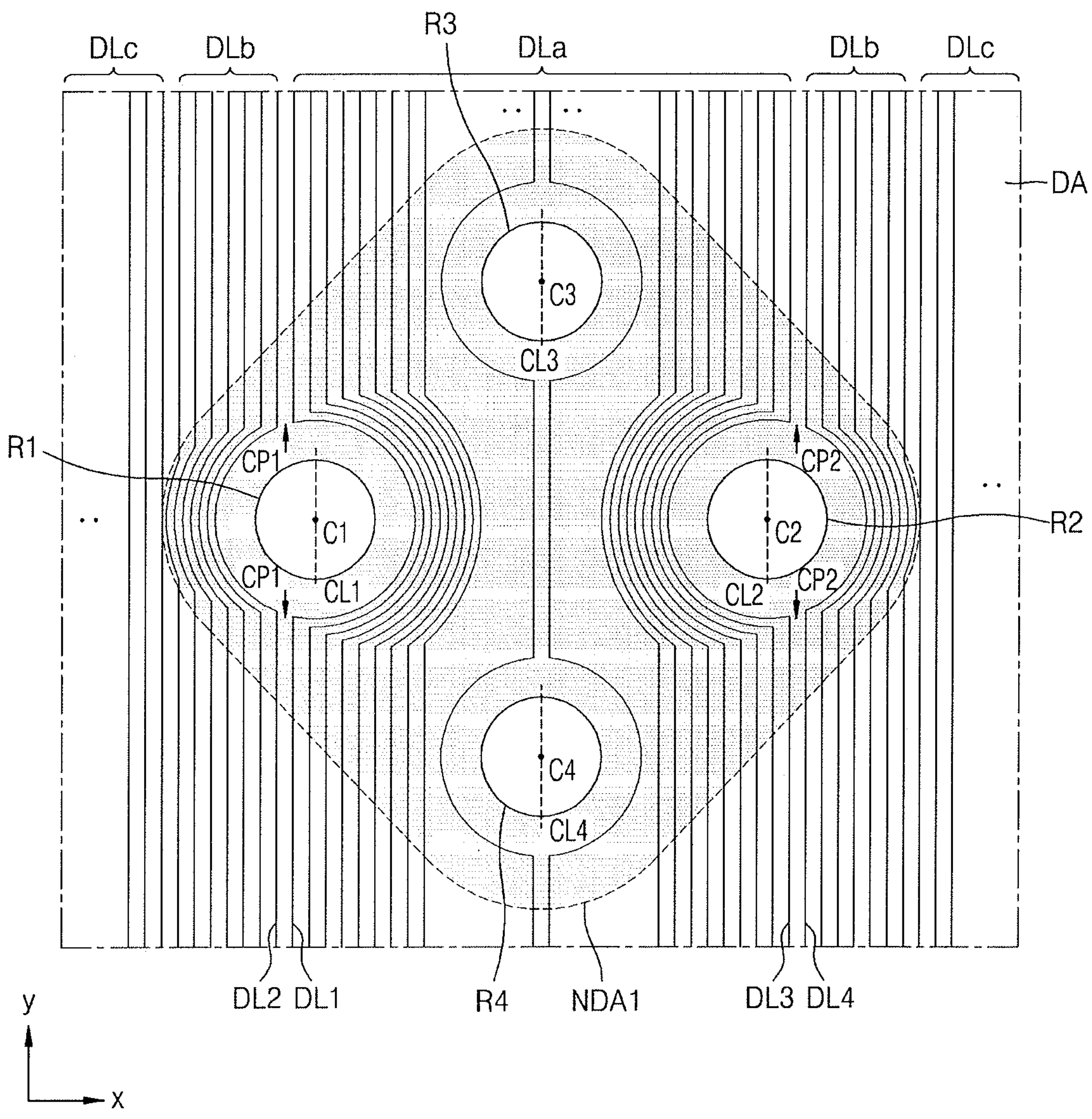

While FIG. 12 illustrates that one third area is spaced apart from the first area R1 and the second area R2 in the y-direction, the present disclosure is not limited thereto. As illustrated in FIG. 13, a plurality of third areas that are spaced apart from the first area R1 and the second area R2 in the y-direction are arranged between the first area R1 and the second area R2. For convenience of description, one of the plurality of third areas will be referred to as a third area R3, and another one will be referred to as a fourth area R4.

Referring to FIG. 13, the third area R3 and the fourth area R4 are respectively spaced apart from the first area R1 and the second area R2 in the y-direction and may be arranged between the first area R1 and the second area R2 in the x-direction.

Those data lines passing through the first non-display area NDA1 and being adjacent to the third and fourth areas R3 and R4 may be symmetrically arranged with respect to third and fourth virtual lines CL3 and CL4 that pass third and fourth centers C3 and C4. The third and fourth virtual lines CL3 and CL4 may be arranged on a same line.

Figure 14:
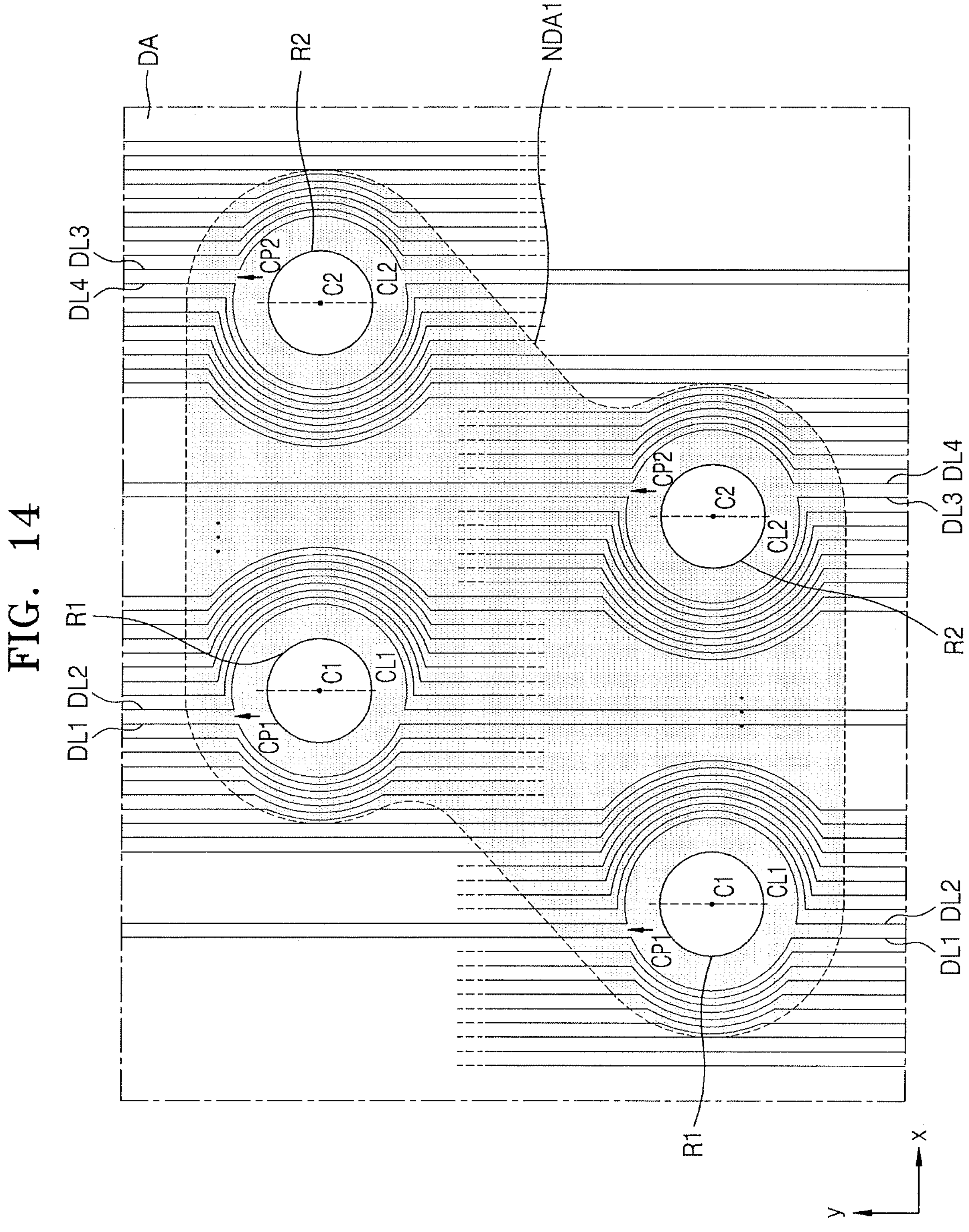

Unlike the four transmission areas included in FIG. 13, e.g., the first through fourth areas R1, R2, R3, and R4, which are arranged symmetrically, areas within the first non-display area NDA1 may be arranged asymmetrically. Referring to FIG. 14, four areas included in a display panel may be regarded as two pairs, each including a first area R1 and a second area R2. For example, when one first area R1 and one second area R2 are grouped and named as a set, a second set may be arranged above a first set, and here, as illustrated in FIG. 14, the first area R1 of the second set may be offset and be located between first and second areas R1 and R2 of the first set. According to another embodiment, an arrangement relationship of transmission areas may be modified in various manners, for example, such that a second set arranged above a first set is not offset but is arranged in parallel to the first set.

While a display panel including two to four transmission areas has been described above with reference to FIGS. 1 through 14, the present disclosure is not limited thereto. According to another embodiment, five or more transmission areas may be included, and in this case also, the arrangement of data lines with respect to two transmission areas, e.g., first and second areas R1 and R2, and characteristics regarding first through third widths are as described above.

While the data lines passing over the first non-display area NDA1 as signal lines have been described in the above embodiments, the present disclosure is not limited thereto. As will be described below, scan lines SLa and SLb may pass by the first non-display area NDA1.

Figure 15:
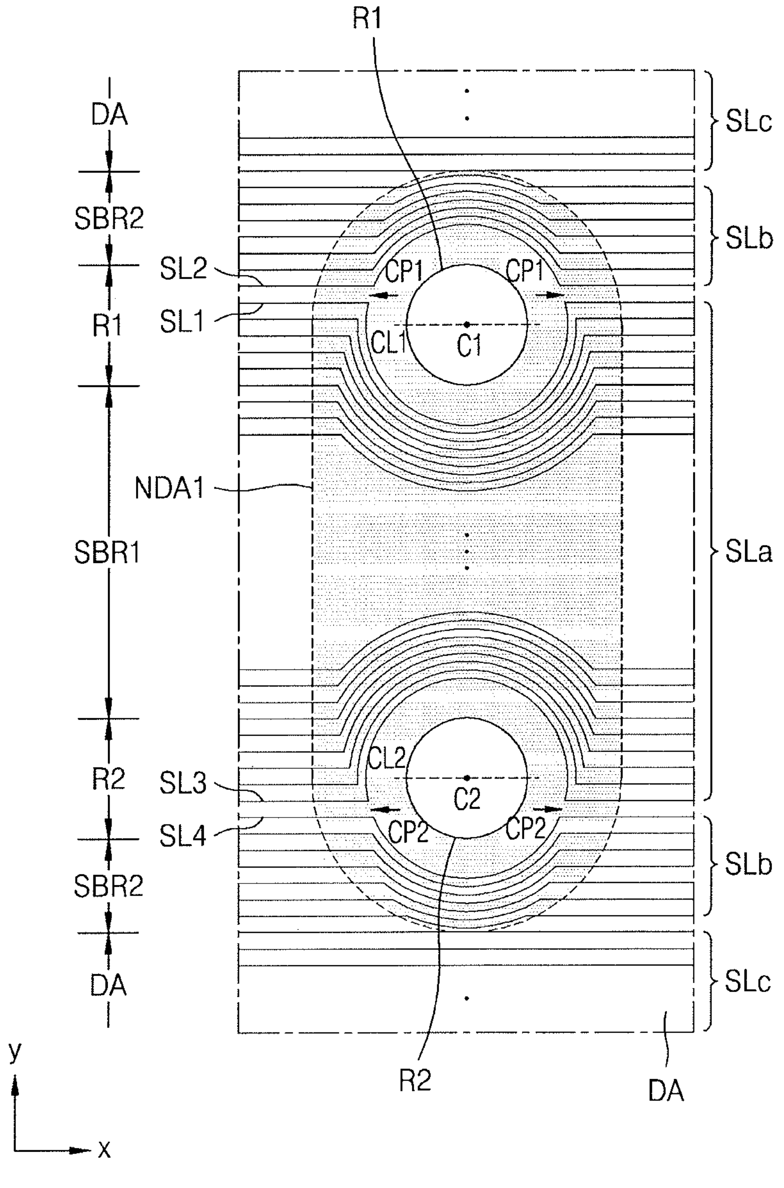
FIG. 15 illustrates an excerpt plan view of a portion of a display panel according to another embodiment.

FIG. 15 is an excerpt plan view illustrating a portion of a display panel according to another embodiment.

Referring to FIG. 15, the first area R1 and the second area R2 may be arranged in the y-direction. Scan lines SLa, SLb, and SLc may extend in the x-direction. Some scan lines SLa and SLb extend in the x-direction to provide a scan signal to pixels located on the left and right side of the first and second areas R1 and R2, e.g., of the first non-display area NDA1, and detour, e.g., bypass, along edges of the first area R1 and the second area R2 in the first non-display area NDA1. The other scan lines SLc may extend in the display area DA substantially along a straight line.

Hereinafter, from among scan lines SLa and SLb passing over the first non-display area NDA1, those scan lines SLa passing over the first sub-non-display area SBR1 between the first area R1 and the second area R2 will be referred to as a first group, and the other scan lines SLb will be referred to as a second group. The scan lines SLb of the second group pass by an area between an edge of the first non-display area NDA1 and an edge of the first area R1 and a second sub-non-display area SBR2 between another edge of the first non-display area NDA1 and an edge of the second area R2.

When referring to an area around the first area R1 illustrated in FIG. 15, some of the scan lines DLa of the first group bypass along a first side of the first area R1 (for example, a lower side of the first area R1 in FIG. 15), and some of the scan lines SLb of the second group bypass along a second side of the first area R1 (an upper side of the first area R1 in FIG. 15). The scan lines SLa of the first group and the scan lines DLb of the second group around the first area R1 bypass in opposite directions to each other at the first point CP1. The first point CP1 is offset from the first virtual line CL1 that passes by the first center C1. For example, as illustrated in FIG. 15, the first point CP1 may be located above the first virtual line CL1 to be adjacent to an edge of the first non-display area NDA1.

Scan lines that bypass along edges of the first area R1 have an asymmetrical shape with respect to the first virtual line CL1. First and second scan lines SL1 and SL2 that are adjacent to each other bypass in opposite directions at the first point CP1. The first scan line SL1 is one of the scan lines SLa of the first group, and the second scan line SL2 is one of the scan lines SLb of the second group.

The first and second scan lines SL1 and SL2 are asymmetrical with respect to the first virtual line CL1, and thus, at least one of a length and a central angle of a first circuitous portion of the first scan line SL1 may be different from the one of a length and a central angle of a second circuitous portion of the second scan line SL2.

Likewise, referring to an area around the second area R2 illustrated in FIG. 15, some of the scan lines SLa of the first group bypass along a first side of the second area R2 (for example, an upper side of the second area R2 in FIG. 15), and some of the scan lines SLb of the second group bypass along a second side of the second area R2 (a lower side of the second area R2 in FIG. 15). The scan lines SLa of the first group and the scan lines SLb of the second group around the second area R2 bypass in opposite directions to each other at the second point CP2. The second point CP2 is offset from the second virtual line CL2 that passes by the second center C2. For example, as illustrated in FIG. 15, the second point CP2 may be located below to be adjacent to an edge of the first non-display area NDA1.

Scan lines that bypass along an edge of the second area R2 have an asymmetrical shape with respect to the second virtual line CL2. Third and fourth scan lines SL3 and SL4 that are adjacent to each other bypass in opposite directions at the second point CP2. The third scan line SL3 is one of the scan lines SLa of the first group, and the fourth scan line SL4 is one of the scan lines SLb of the second group.

The third and fourth scan lines SL3 and SL4 are asymmetrical with respect to the second virtual line CL2, and thus, at least one of a length and a central angle of a third circuitous portion of the third scan line SL3 may be different from the one of a length and a central angle of a fourth circuitous portion of the fourth scan line SL4.

While the display panel in FIG. 15 is described as including two transmission areas and that scan lines detour around the transmission areas, the present disclosure is not limited thereto. According to another embodiment, a display panel may include three or more transmission areas, and characteristics regarding the arrangement of scan lines accordingly will be obvious to derive from the description provided above with reference to FIGS. 1 through 14 and embodiments derived therefrom.

By way of summation and review, as a method of extending functions to be connected or linked to a display device, a display panel may include a plurality of areas in which a camera, a sensor, or the like may be arranged within an internal area of a display area, and a display device including the display panel may be provided. However, in this case, dead zones may increase as wirings detour, e.g., curve around, the above-described plurality of areas.

In contrast, one or more embodiments may provide a structure whereby dead zones around the above-described plurality of areas may be reduced. That is, according to one or more embodiments, signal lines around an area corresponding to electronic elements, e.g., a sensor or a camera, are arranged asymmetrically, and thus, dead zones between a display area and the areas corresponding to the electronic elements may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display panel, comprising:

a substrate including first and second optical areas, wherein the first and second optical areas are surrounded by a first non-display area and spaced apart from each other in a first direction;

a display area in which a plurality of light-emitting diodes are arranged, the display area surrounding the first non-display area; and a plurality of signal lines electrically respectively connected to the plurality of light-emitting diodes, wherein the plurality of signal lines comprises a first signal line, a second signal line, a third signal line, and a fourth signal line, wherein, in the display area, the first and second signal lines are respectively disposed on opposite sides with respect to a first virtual center line passing through a center of the first optical area in a second direction crossing the first direction, in the first non-display area, the first and second signal lines bypass the first optical area along a first side of the first optical area, wherein the first side of the first optical area is opposite to a second side of the first optical area, the first and second sides of the first optical area are opposite to each other with the first virtual center line therebetween, and the first side of the first optical area is closer to the second optical area than the second side of the first optical area, in the display area, the third and fourth signal lines are respectively disposed on opposite sides with respect to a second virtual center line passing through a center of the second optical area in the second direction, and in the first non-display area, the third signal line bypasses the second optical area along a first side of the second optical area and the fourth signal line bypasses the second optical area along a second side of the second optical area, wherein the first side and the second side of the second optical area are opposite to each other with the second virtual center line therebetween.

2. The display panel as claimed in claim 1, wherein the first optical area or the second optical area has a circular shape.

3. The display panel as claimed in claim 1, wherein:

in the first non-display area, the first, second, and third signal lines are between the first optical area and the second optical area.

4. The display panel as claimed in claim 1, wherein the first non-display area includes a first edge and a second edge opposite to the first edge with the first optical area and the second optical area between the first edge and the second edge, and wherein the first edge is adjacent to the first optical area and the second edge is adjacent to the second optical area, wherein the plurality of signal lines comprises:

a first group of signal lines disposed in a first portion of the first non-display area, the first portion of the first non-display area being between the first and second optical areas; and a second group of signal lines disposed in a second portion of the first non-display area, the second portion of the first non-display area being between the first edge of the first non-display area and the first optical area, and wherein a number of signal lines of the first group is greater than a number of signal lines of the second group.

5. The display panel as claimed in claim 1, wherein:

a pitch between two adjacent signal lines in the display area is greater than a pitch of the two adjacent signal lines in the first non-display area.

6. The display panel as claimed in claim 1, wherein:

two adjacent signal lines of the plurality of signal lines are on different layers from each other in the first non-display area.

7. The display panel as claimed in claim 1, wherein:

the substrate has an opening corresponding to one of the first and second optical areas.

8. The display panel as claimed in claim 1, wherein:

the plurality of signal lines includes data lines or scan lines.

9. A display device, comprising:

a display panel comprising:

a substrate including first and second optical areas, wherein the first and second optical areas are surrounded by a first non-display area and spaced apart from each other in a first direction;

a display area in which a plurality of light-emitting diodes are arranged, the display area surrounding the first non-display area; and a plurality of signal lines electrically respectively connected to the plurality of light-emitting diodes, wherein the plurality of signal lines comprises a first signal line, a second signal line, a third signal line, and a fourth signal line, and first and second components respectively correspond to the first and second optical areas, wherein, in the display area, the first and second signal lines are respectively disposed on opposite sides with respect to a first virtual center line passing through a center of the first optical area in a second direction crossing the first direction, in the first non-display area, the first and second signal lines bypass the first optical area along a first side of the first optical area, wherein the first side of the first optical area is opposite to a second side of the first optical area, the first and second sides of the first optical area are opposite to each other with the first virtual center line therebetween, and the first side of the first optical area is closer to the second optical area than the second side of the first optical area, in the display area, the third and fourth signal lines are respectively disposed on opposite sides with respect to a second virtual center line passing through a center of the second optical area in the second direction, in the first non-display area, the third signal line bypasses the second optical area along a first side of the second optical area and the fourth signal line bypasses the second optical area along a second side of the second optical area, wherein the first side and the second side of the second optical area are opposite to each other with the second virtual center line therebetween.

10. The display device as claimed in claim 9, wherein:

the plurality of signal lines includes data lines or scan lines.

11. The display device as claimed in claim 9, wherein:

each of the first and second components comprises a sensor or a camera.

12. The display device as claimed in claim 9, wherein:

the first optical area or the second optical area has a circular shape.

13. A display panel, comprising:

a substrate including first and second optical areas, wherein the first and second optical areas are surrounded by a first non-display area and spaced apart from each other in a first direction;

a display area in which a plurality of light-emitting diodes are arranged, the display area surrounding the first non-display area; and a plurality of signal lines electrically respectively connected to the plurality of light-emitting diodes, wherein the plurality of signal lines comprises a first signal line, a second signal line, a third signal line, and a fourth signal line, wherein, in the display area, the first and second signal lines are respectively disposed on opposite sides with respect to a first virtual center line passing through a center of the first optical area in a second direction crossing the first direction, in the first non-display area, the first and second signal lines bypass the first optical area along a first side of the first optical area, wherein the first side of the first optical area is opposite to a second side of the first optical area, the first and second sides of the first optical area are opposite to each other with the first virtual center line therebetween, and the first side of the first optical area is closer to the second optical area than the second side of the first optical area, in the display area, the third and fourth signal lines are respectively disposed on opposite sides with respect to a second virtual center line passing through a center of the second optical area in the second direction, in the first non-display area, the third and fourth signal lines bypass the second optical area along a first side of the second optical area, wherein the first side of the second optical area is opposite to a second side of the second optical area, the first and second sides of the second optical area are opposite to each other with the second virtual center line therebetween, and the first side of the second optical area is closer to the first optical area than the second side of the second optical area.

14. The display panel as claimed in claim 13, wherein the first optical area or the second optical area has a circular shape.

15. The display panel as claimed in claim 13, wherein:

in the first non-display area, the first, second, third and fourth signal lines are between the first optical area and the second optical area.

16. The display panel as claimed in claim 13, wherein the first non-display area includes a first edge and a second edge opposite to the first edge with the first optical area and the second optical area between the first edge and the second edge, and wherein the first edge is adjacent to the first optical area and the second edge is adjacent to the second optical area, wherein the plurality of signal lines comprises:

a first group of signal lines disposed in a first portion of the first non-display area, the first portion of the first non-display area being between the first and second optical areas; and a second group of signal lines disposed in a second portion of the first non-display area, the second portion of the first non-display area being between the first edge of the first non-display area and the first optical area, and wherein a number of signal lines of the first group is greater than a number of signal lines of the second group.

17. The display panel as claimed in claim 13, wherein:

a pitch between two adjacent signal lines in the display area is greater than a pitch of the two adjacent signal lines in the first non-display area.

18. The display panel as claimed in claim 13, wherein:

two adjacent signal lines of the plurality of signal lines are on different layers from each other in the first non-display area.

19. The display panel as claimed in claim 13, wherein:

the substrate has an opening corresponding to one of the first and second optical areas.

20. The display panel as claimed in claim 13, wherein:

the plurality of signal lines includes data lines or scan lines.

21. A display device, comprising:

a display panel comprising:

a substrate including first and second optical areas, wherein the first and second optical areas surrounded by a first non-display area and spaced apart from each other in a first direction;

a display area in which a plurality of light-emitting diodes are arranged, the display area surrounding the first non-display area; and a plurality of signal lines electrically respectively connected to the plurality of light-emitting diodes, wherein the plurality of signal lines comprises a first signal line, a second signal line, a third signal line, and a fourth signal line, and first and second components respectively corresponding to the first and second optical areas, wherein, in the display area, the first and second signal lines are respectively disposed on opposite sides with respect to a first virtual center line passing through a center of the first optical area in a second direction crossing the first direction, in the first non-display area, the first and second signal lines bypass the first optical area along a first side of the first optical area, wherein the first side of the first optical area is opposite to a second side of the first optical area, the first and second sides of the first optical area are opposite to each other with the first virtual center line therebetween, and the first side of the first optical area is closer to the second optical area than the second side of the first optical area, in the display area, the third and fourth signal lines are respectively disposed on opposite sides with respect to a second virtual center line passing through a center of the second optical area in the second direction, in the first non-display area, the third and fourth signal lines bypass the second optical area along a first side of the second optical area, wherein the first side of the second optical area is opposite to a second side of the second optical area, the first and second sides of the second optical area are opposite to each other with the second virtual center line therebetween, and the first side of the second optical area is closer to the first optical area than the second side of the second optical area.

22. The display device as claimed in claim 21, wherein:

the plurality of signal lines includes data lines or scan lines.

23. The display device as claimed in claim 21, wherein:

each of the first and second components comprises a sensor or a camera.

24. The display device as claimed in claim 21, wherein:

the first optical area or the second optical area has a circular shape.

25. A display panel, comprising:

a substrate including first and second optical areas, wherein the first and second optical areas are surrounded by a first non-display area and spaced apart from each other in a first direction;

a display area in which a plurality of light-emitting diodes are arranged, the display area surrounding the first non-display area; and a plurality of signal lines electrically respectively connected to the plurality of light-emitting diodes, wherein:

the plurality of signal lines extends in a second direction crossing the first direction in the display area, in the first non-display area, the plurality of signal lines bypass the first and second optical areas, and a number of signal lines of the plurality of signal lines that bypass the first optical area along a first side of the first optical area is less than a number of signal lines of the plurality of signal lines that bypass the first optical area along a second side of the first optical area, wherein the second side of the first optical area is opposite to the first side of the first optical area with a first virtual center line therebetween, the first virtual center line passing through a center of the first optical area in the second direction, and wherein the second side of the first optical area is closer to the second optical area than the first side of the first optical area.

26. The display panel as claimed in claim 25, wherein the first optical area or the second optical area has a circular shape.

27. The display panel as claimed in claim 25, wherein:

in the first non-display area, a number of signal lines of the plurality of signal lines that bypass the second optical area along a first side of the second optical area is a same as a number of signal lines of the plurality of signal lines that bypass the second optical area along a second side of the second optical area, wherein the first side of the second optical area is opposite to the second side of the second optical area with a second virtual center line therebetween, the second virtual center line passing through a center of the second optical area in the second direction, and wherein the first side of the second optical area is closer to the first optical area than the second side of the second optical area.

28. The display panel as claimed in claim 25, wherein:

a pitch between two adjacent signal lines in the display area is greater than a pitch of the two adjacent signal lines in the first non-display area.

29. The display panel as claimed in claim 25, wherein:

two adjacent signal lines of the plurality of signal lines are on different layers from each other in the first non-display area.

30. The display panel as claimed in claim 25, wherein:

the plurality of signal lines includes data lines or scan lines.

31. A display device, comprising:

a display panel according to claim 25; and first and second components respectively corresponding to the first and second optical areas of the display panel, wherein each of the first and second components comprises a sensor or a camera.

* * * * *